United States Patent
Piret et al.

(12) 
(10) Patent No.: US 6,438,112 B1
(45) Date of Patent: Aug. 20, 2002

(54) DEVICE AND METHOD FOR CODING INFORMATION AND DEVICE AND METHOD FOR DECODING CODED INFORMATION

(75) Inventors: Philippe Piret, Cesson-Sevigne; Claude Le Dantec, Saint Hilaire des Landes, both of (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/096,516

(22) Filed: Jun. 12, 1998

(30) Foreign Application Priority Data

Jun. 13, 1997 (FR) .............................. 97 07360
Jun. 13, 1997 (FR) .............................. 97 07359

(51) Int. Cl.$^7$ .......................... H04J 11/00; H04J 3/12; H04B 1/38; H04L 5/16; H04L 27/04
(52) U.S. Cl. ..................... 370/298; 370/203; 370/524; 370/538; 375/222; 375/262; 375/265; 375/295; 714/755; 714/762; 714/789
(58) Field of Search .................. 370/298, 299, 370/316, 346, 347, 524, 538, 203, 209, 208; 375/222, 259, 261, 262, 265, 298, 340, 341; 714/755, 761, 762, 792, 759, 789

(56) References Cited

U.S. PATENT DOCUMENTS

| | | | |
|---|---|---|---|
| 5,168,509 A | * 12/1992 | Nakamura et al. | 375/286 |
| 5,521,943 A | * 5/1996 | Dambacher | 375/295 |
| 5,654,986 A | * 8/1997 | Lim | 375/341 |
| 5,832,041 A | * 11/1998 | Hulyalkar | 375/340 |
| 5,996,104 A | * 11/1999 | Herzberg | 714/755 |
| 6,233,712 B1 | * 5/2001 | Rhee et al. | 714/789 |
| 6,269,129 B1 | * 7/2001 | Rhee et al. | 375/341 |
| 6,289,000 B1 | * 9/2001 | Yonge, III | 370/203 |

FOREIGN PATENT DOCUMENTS

| | | |
|---|---|---|
| EP | 0122805 | 10/1984 |
| EP | 0154415 | 9/1985 |
| EP | 0282298 | 9/1988 |
| EP | 0481549 | 4/1992 |
| EP | 0506185 | 9/1992 |
| EP | 0687074 | 12/1995 |
| EP | 0717520 | 6/1996 |
| EP | 0773628 | 5/1997 |

* cited by examiner

*Primary Examiner*—Huy D. Vu
*Assistant Examiner*—M. Phan
(74) *Attorney, Agent, or Firm*—Fitzpatrick, Cella, Harper & Scinto

(57) ABSTRACT

The information coding device has:
- a first labeling means adapted to associate, with the information to be coded, K "initial" first degree polynomials,
- a coding means which performs a polynomial calculation:
  - to form K "coded" sequences of P, greater than or equal to K, "coded" polynomials, the first being equal to one of the K initial polynomials and the others to the product of the preceding polynomial and a predetermined polynomial, and
  - to form a "resultant" sequence of P "resultant" polynomials respectively equal to the sums of the coded polynomials of same rank of the K coded sequences,
- a second one-to-one labeling means adapted to label the points of a quadrature amplitude modulation signal constellation with the $Q^2$ resultant polynomials, for two adjacent points of the constellation, the polynomials labeling them have one identical coefficient and the other coefficient differing only by 1 modulo Q, and
- a modulator for quadrature amplitude modulation.

59 Claims, 13 Drawing Sheets

Figure 1:
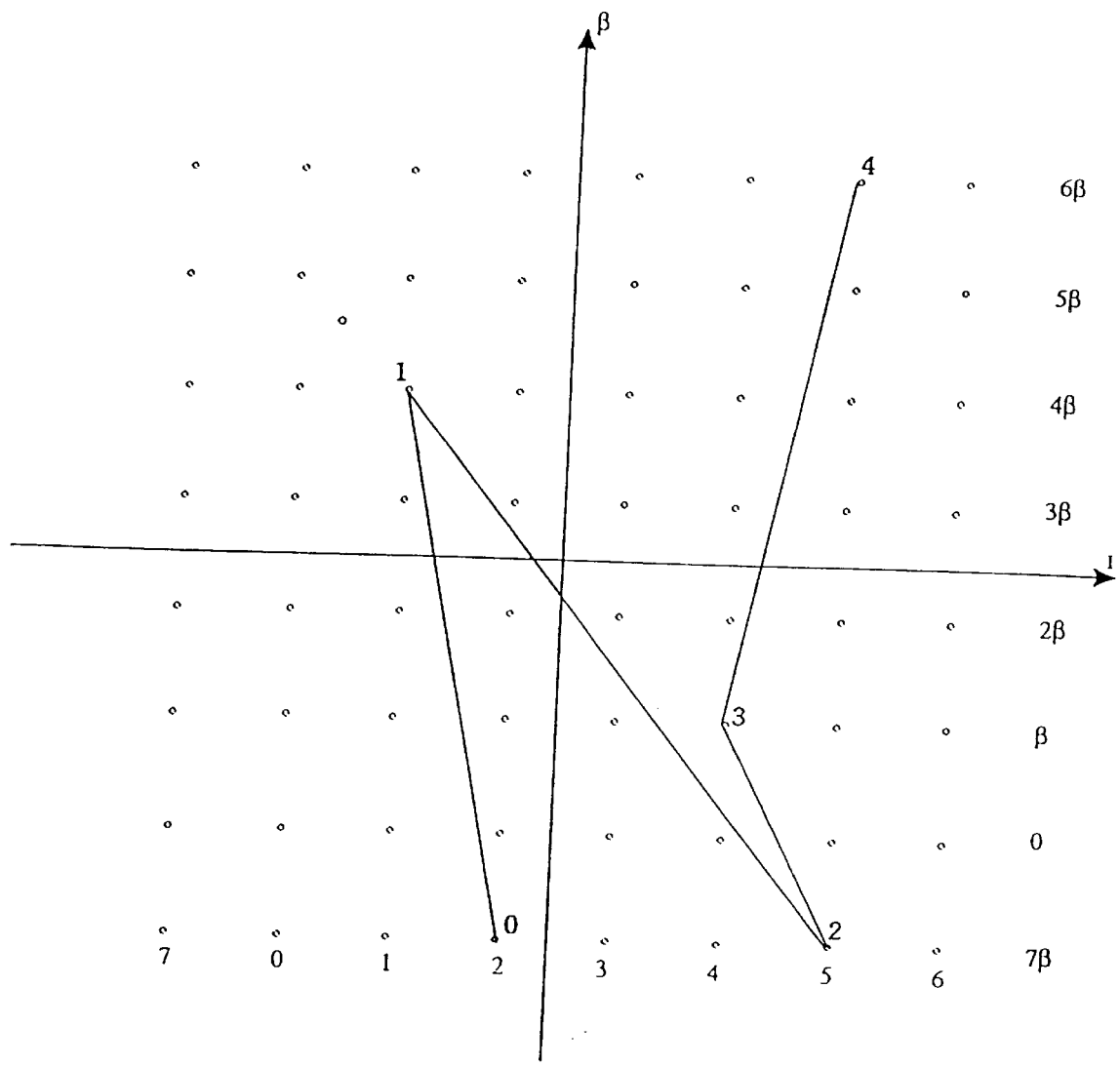

DEVICE AND METHOD FOR CODING INFORMATION AND DEVICE AND METHOD FOR DECODING CODED INFORMATION

The present invention relates to a device and a method for coding information and to a device and a method for decoding coded information.

It applies in particular to the transmission of information by quadrature amplitude modulation, on any transmission channel using this modulation.

Quadrature amplitude modulation of signals is well known in the communications field. According to this modulation technique, information to be transmitted has associated with it a signal of constant frequency but whose amplitude and phase represent the said information.

However, on reception, these signals may sometimes be difficult to identify when the signal has been distorted or affected by noise during transmission.

In addition, the spectrum of these signals can be relatively narrow compared with the spectrum available for transmission. This gives rise to known drawbacks. By way of example, two of these drawbacks are mentioned below:

when the energy of the signals is concentrated in a spectrum which is too narrow, these signals are easily disturbed by noise or detected and interfered with by any enemies;

for certain applications, regulations make it necessary to distribute the energy of the signals sufficiently over the entire frequency band available.

The invention intends to remedy these drawbacks by proposing a method and a device for coding information having the following advantages:

the signals are more difficult to detect and interfere with;

distribution of the energy over the available frequency band is improved;

resistance of the signals to unintentional noise is increased.

Known labeling methods associate, with the $2^d$ points of a constellation representing the amplitude pairs used, polynomials of degree d−1 in B, all the coefficients of which are binary, allowing the use of polynomial calculations. These methods have the drawback that the proximity between the points of the constellation, a proximity which relates to the risks of error between these points, is not well taken into account. In addition, the correction of errors in transmitting the information represented by these signals is not facilitated by these labeling methods.

The present invention intends to remedy these drawbacks.

For this purpose, according to a first aspect, the present invention relates to a device for coding information, characterized in that it has:

a first labeling means adapted to associate. with the information to be coded, K initial first degree polynomials, each of these two coefficients of the said initial polynomials being an integer number between 0 and Q−1 inclusive.

a coding means which performs a polynomial calculation:

to form K coded sequences of a number P greater than or equal to K of coded polynomials, the first coded polynomial of each of these K sequences being equal to one of the K initial polynomials and each of the other coded polynomials of the said sequence being equal to the product of the polynomial preceding it in the sequence and a predetermined polynomial, the coefficients of the coded polynomials being calculated modulo Q and the coded polynomial being calculated modulo an irreducible second degree polynomial, and to form a resultant sequence of P resultant polynomials respectively equal to the modulo Q sums of the coded polynomials of same rank of the K coded sequences, a second one-to-one labeling means adapted to label the $Q^2$ pairs of numbers representing the co-ordinates of the $Q^2$ points of a $Q^2$-point quadrature amplitude modulation signal constellation, with the $Q^2$ resultant polynomials, in such a way that, if two points of the constellation have one identical co-ordinate and the other co-ordinate as close as possible, then the polynomials labeling them will have one identical coefficient and the other coefficient differing only by 1 modulo Q, and a modulator adapted to convert each of the P resultant polynomials into a quadrature amplitude modulated signal, the amplitude pair of which is labeled by the said polynomial.

By virtue of these provisions, each of the polynomials in the sequence is associated with a pair of quadrature amplitudes, which makes it possible for the proximity between two of the pairs to correspond to a relationship between the polynomials which correspond to them.

In addition, the spectrum used for the transmission of the information is thus more spread out than the spectrum of a simple modulation of a signal.

According to a particular characteristic, the number Q is a power of a prime number.

By virtue of this provision, a decoding of the coded information can be performed using inverses of sub-matrices of the matrix used by the coding means.

According to other particular characteristics, the coding means uses a matrix having:

K lines of a number P greater than or equal to K, of elements representing polynomials in the finite ring of first degree polynomials with an integer coefficient taken modulo Q, and at least one sub-matrix of dimensions K×K adapted to be inverted.

By virtue of these provisions, a large number of sub-matrices have an odd determinant. Each of these odd determinants enables a decoding device to determine an estimation of the polynomials supplied by the first labeling means. The multiplication of the number of estimations which can thus be used allows a statistical decoding processing.

When the channel transmitting the coded data is subject to noise, the estimation of the representative polynomials is, thus more reliable than a simple method of statistical approximation on each demodulated polynomial.

According to other particular characteristics:

the decoding means performs the polynomial calculation by using a recursion the first labeling means is adapted to associate with the information to be coded, K previous polynomials and then to multiply a matrix formed by these K previous polynomials by an invertible matrix of dimensions K×K in order to produce the K initial polynomials.

By virtue of these provisions, a systematic coding can be performed, that is to say a coding in which the first resultant polynomials each represent one and only one initial polynomial.

According to a second aspect, the present invention relates to a method of coding information, characterized in that it includes:

a first labeling operation, during which K initial first degree polynomials are associated with the information to be coded, each of the two coefficients of the said initial polynomials being an integer number between 0 and Q−1, inclusive, a coding operation which performs a polynomial calculation:

to form K coded sequences of a number P greater than or equal to K of coded polynomials, the first coded polynomial of each of these K sequences being equal to one of the K initial polynomials and each of the other coded polynomials of the said sequence being equal to the product of the polynomial preceding it in the sequence and a predetermined polynomial, the coefficients of the coded polynomial being calculated modulo Q and the coded polynomial being calculated modulo an irreducible second degree polynomial, and to form a resultant sequence of P resultant polynomials respectively equal to the modulo Q sums of the coded polynomials of same rank of the K coded sequences.

a second operation of one-to-one labeling of $Q^2$ pairs of amplitudes by means of the $Q^2$ resulting polynomials able to be formed during the coding operation, any incrementation or decrementation of one of the components, by a predetermined value, when the other remains fixed, corresponding to the incrementation by one, modulo Q, of only one of the coefficients of the resulting polynomial, the other coefficient remaining fixed, a modulation operation, during which each of the P resulting polynomials is converted into a quadrature amplitude modulation signal where the pair of amplitudes is labeled by the said polynomial.

The invention also intends to propose a method and a device for decoding coded information which has a resistance to added noise.

To this end, according to a third aspect, the present invention relates to a device for decoding coded initial information, characterized in that it has:

a demodulator adapted to demodulate P signals modulated as the points of a quadrature amplitude modulation constellation into a demodulated sequence of P demodulated points representing a K-tuple of initial information, a processing means adapted to:

choose K-tuples of demodulated points likely to allow calculation of the K-tuple of initial information to which they correspond, determine, for each K-tuple of demodulated points chosen, K-tuples, referred to as "neighbors", of points in the said constellation which are close to the chosen K-tuple of demodulated points, calculate, for each K-tuple of neighboring points, the K-tuple of initial information to which it corresponds and assign to this K-tuple of initial information an affinity dependent upon the distance between the said K-tuple of neighboring points and the chosen K-tuple of demodulated points to which it is attached, add up, for each calculated K-tuple of initial information, or for each item of initial information of the calculated K-tuples of initial information, the affinities which are assigned to it, and estimate, respectively, the K-tuple of initial information actually coded, or each item of initial information of the K-tuple of initial information actually coded as being the one which has the highest sum of affinities.

According to a fourth aspect, the present invention relates to a device for decoding coded information, characterized in that it has:

a demodulator adapted to demodulate P successive quadrature amplitude modulated signals, the two components of which represent the coefficients of K polynomials of the first degree, referred to as "initial polynomials", into a demodulated sequence of P demodulated first degree polynomials, the coefficients of same degree of the said demodulated polynomials successively representing one of the components of the corresponding demodulated signal, and a processing means adapted to:

choose K-tuples of demodulated polynomials likely to allow calculation of the K-tuple of initial polynomials to which they correspond, determine, for each K-tuple of demodulated polynomials chosen, K-tuples of neighboring polynomials representing K-tuples of points of the constellation close to the K-tuple of component pairs represented by the chosen K-tuple of demodulated polynomials, calculate, for each K-tuple of neighboring polynomials, the K-tuple of initial polynomials to which it corresponds and assign to this K-tuple of initial polynomials an affinity dependent upon the distance between the said K-tuple of points represented by the K-tuple of neighboring polynomials and the K-tuple of component pairs represented by the chosen K-tuple of demodulated polynomials to which it is attached, add up, for each calculated K-tuple of initial polynomials or for each initial polynomial of the calculated K-tuples of initial polynomials, the affinities which are assigned to it, and estimate, respectively, the K-tuple of initial polynomials actually coded or each initial polynomial of the K-tuple of initial polynomials, actually coded as being the one which has the highest sum of affinities.

By virtue of these provisions, each point or polynomial of the demodulated sequence is associated with neighboring points or polynomials which have a high probability of corresponding to the initial information, according to known laws on noise affecting signals modulated by quadrature amplitude modulation: for a Gaussian channel, the risk of confusion is related to the distance between neighboring points of the constellation and the proximity between two demodulated quadrature component pairs corresponds to a high probability of confusion between the modulated signals from which they originate.

Thus, the invention makes it possible to decode coded information by:

a coding means which performs a polynomial calculation:

to form K coded sequences of a number P greater than or equal to K of coded polynomials, the first coded polynomial of each of these K sequences being equal to one of the K initial polynomials and each of the other coded polynomials of the said sequence being equal to the product of the polynomial preceding it in the sequence and a predetermined polynomial, and to form a resultant sequence of P resultant polynomials respectively equal to the modulo Q sums of the coded polynomials of same rank of the K coded sequences, a second one-to-one labeling means adapted to label the $Q^2$ pairs of numbers representing the coordinates of the $Q^2$ points of a $Q^2$-point quadrature amplitude modulation signal constellation, with the $Q^2$ resultant polynomials, in such a way that, if two points of the constellation have one identical coordinate and the other coordinate as close as possible, then the polynomials labeling them will have one identical coefficient and the other coefficient differing only by 1 modulo Q, and a modulator adapted to convert each of the P resultant polynomials into a quadrature amplitude modulated signal, the amplitude pair of which is labeled by the said polynomial.

The device according to the invention, by comparison with the devices using the maximum probability method which consists of performing a correlation between all the code words and what has been received, has a simpler construction and faster operation while having comparable performance.

According to particular characteristics, the processing means is adapted to assign to each K-tuple of initial polynomials an affinity decreasing as a function of the distance between the K-tuple of points represented by the K-tuple of neighboring polynomials and the K-tuple of component pairs represented by the chosen K-tuple of demodulated polynomials to which it is attached.

By virtue of these provisions, the summed affinities each represent the probability that the K-tuple of neighboring polynomials considered is the K-tuple of initial polynomials which is at the origin of the K-tuple of demodulated polynomials.

According to a fifth aspect, the present invention relates to a method of decoding coded initial information, characterized in that it consists of:

a demodulation operation, during which P signals modulated as the points of a quadrature amplitude modulation constellation are demodulated into a demodulated sequence of P demodulated points representing a K-tuple of initial information, a processing phase consisting of:
a selection operation, during which K-tuples of demodulated points likely to allow calculation of the K-tuple of initial information to which they correspond are chosen, a determination operation during which, for each of the chosen K-tuples of demodulated points, K-tuples, referred to as "neighbors", of points in the said constellation which are close to the chosen K-tuple of demodulated points are determined, a calculation operation during which, for each K-tuple of neighboring points, the K-tuple of initial information to which it corresponds is calculated and this K-tuple of initial information is assigned an affinity dependent upon the distance between the said K-tuple of neighboring points and the chosen K-tuple of demodulated points to which it is attached, a summation operation during which,
for each calculated K-tuple of initial information, or
for each item of initial information of the calculated K-tuples of initial information,
the affinities which are assigned to it are summed, and
an estimation operation during which, respectively,
the K-tuple of initial information actually coded, or
each item of initial information of the K-tuple of initial information, actually coded
is estimated as being the one which has the highest sum of affinities.

According to a sixth aspect, the present invention relates to a method of decoding coded information, characterized in that it consists of:
a demodulation operation during which P successive quadrature amplitude modulated signals are demodulated, the two components of which represent the coefficients of K polynomials of the first degree referred to as "initial polynomials", into a demodulated sequence of P demodulated first degree polynomials, the coefficients of same degree of the said demodulated polynomials successively representing one of the components of the corresponding demodulated signal, and a processing phase consisting of:
a selection operation during which K-tuples of demodulated polynomials likely to allow calculation of the K-tuple of initial polynomials to which they correspond are chosen, a determination operation during which, for each of the chosen K-tuples of demodulated polynomials, K-tuples of neighboring polynomials are determined, representing K-tuples of points of the constellation close to the K-tuple of component pairs represented by the chosen K-tuple of demodulated polynomials, a calculation operation, during which, for each K-tuple of neighboring polynomials, the K-tuple of initial polynomials to which it corresponds is calculated and this K-tuple of initial polynomials is assigned an affinity dependent upon the distance between the K-tuple of points represented by the said K-tuple of neighboring polynomials and the K-tuple of component pairs represented by the chosen K-tuple of demodulated polynomials to which it is attached, a summation operation, during which,
for each calculated K-tuple of initial polynomials or
for each initial polynomial of the calculated K-tuples of initial polynomials,
the affinities which are assigned to it are added up, and
an estimation operation, during which, respectively,
the K-tuple of initial polynomials actually coded or
each initial polynomial of the K-tuple of initial polynomials actually coded
is estimated as being the one which has the highest sum of affinities.

The invention also relates to a computer, a facsimile machine, an information processing system, an information capture system (such as a video camera, a digital camera, a scanner, a copier, etc.) and an information reproduction system (such as a printer, a copier, etc.), characterized in that they have:
an information coding device as briefly disclosed above, or
an information decoding device as briefly disclosed above, and a microprocessor system adapted to implement the method as briefly disclosed above.

The present invention also concerns a storage medium, or memory, such as a floppy disk or a CD-ROM, for storing thereon instructions which, when executed by a processor, cause the processor to implement the method as briefly disclosed above.

Since this method and these devices have the same advantages as the devices briefly disclosed above, these are not repeated here.

Figure 2:
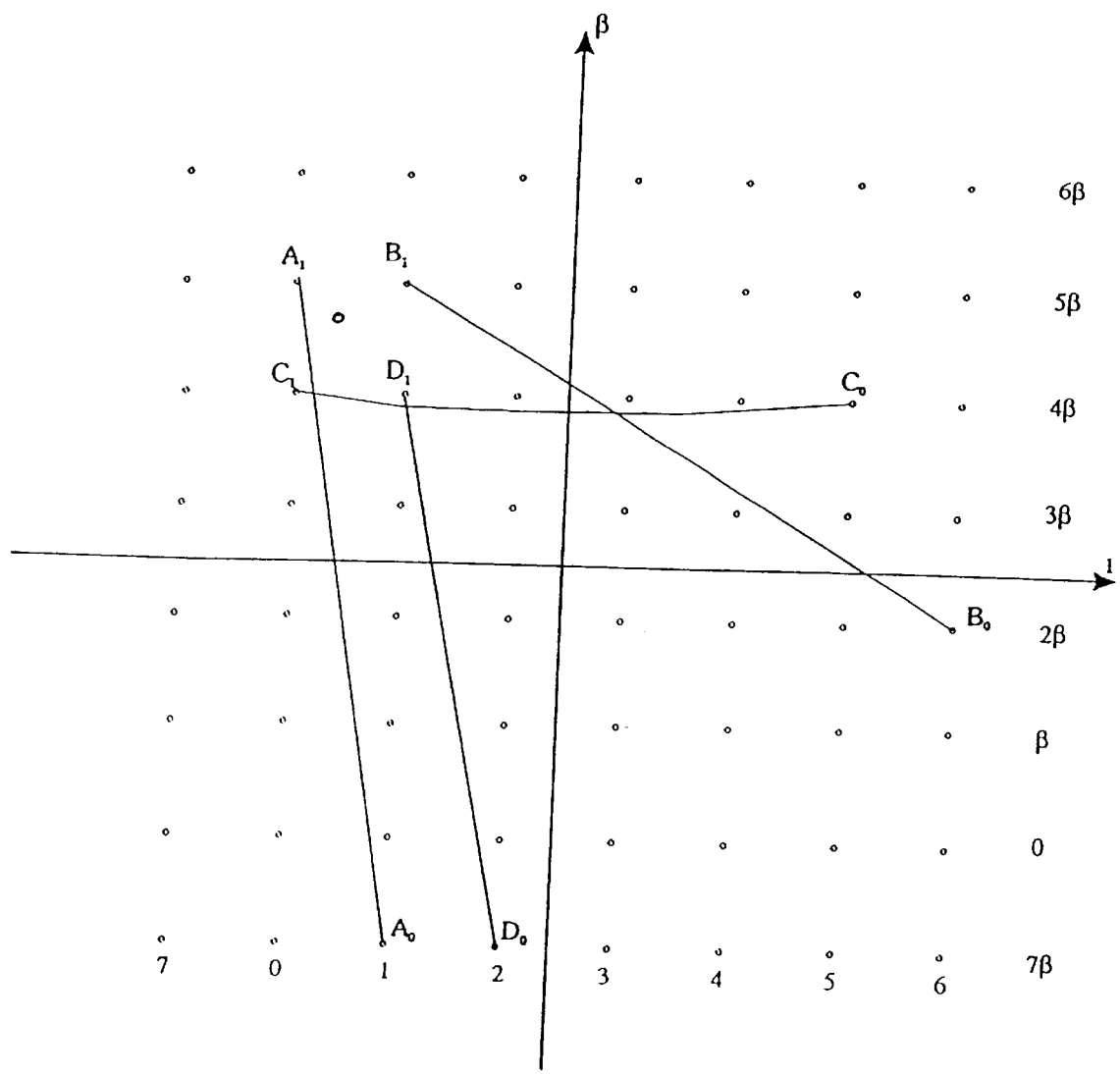
Figure 3:
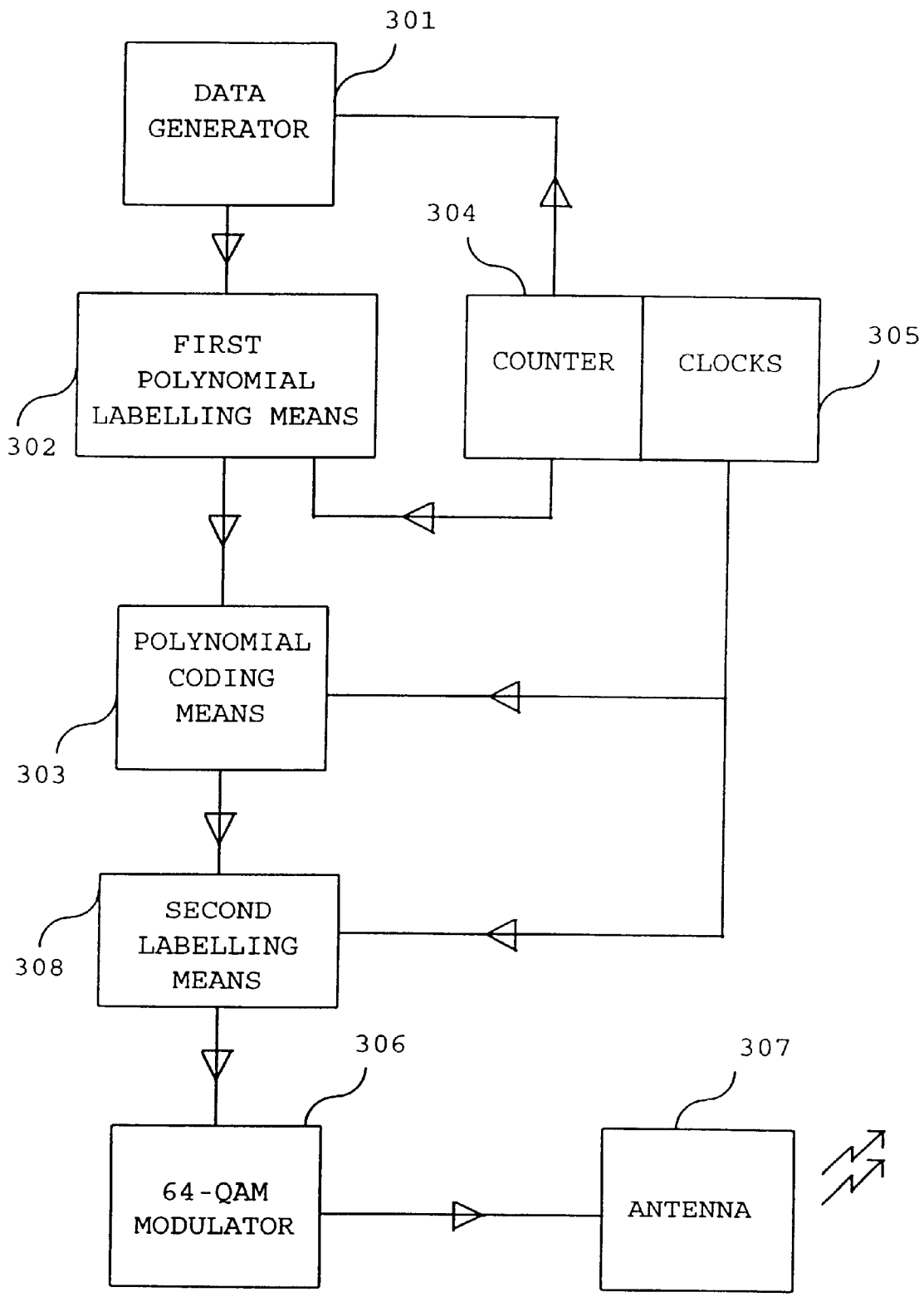
Figure 4:
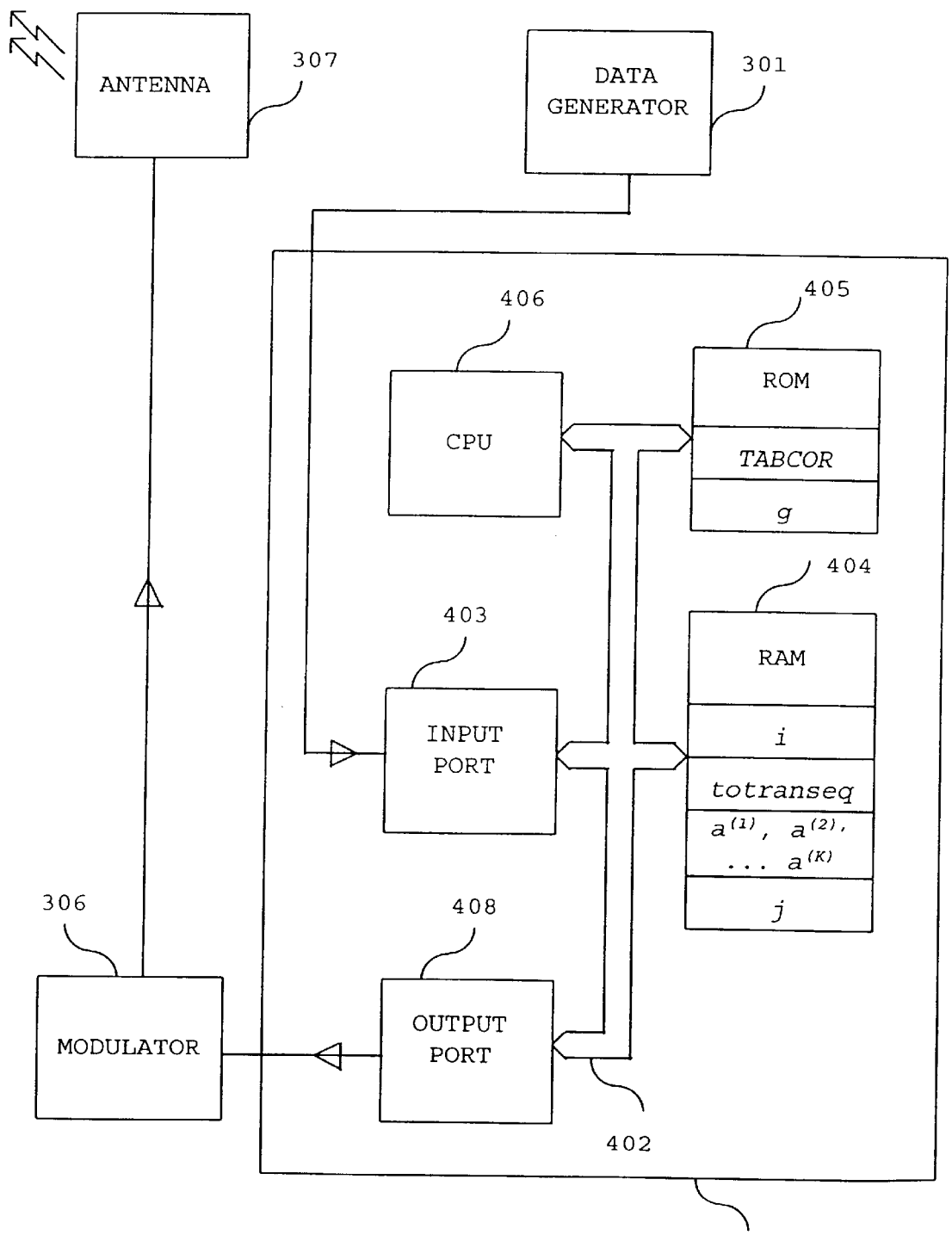
Figure 5:
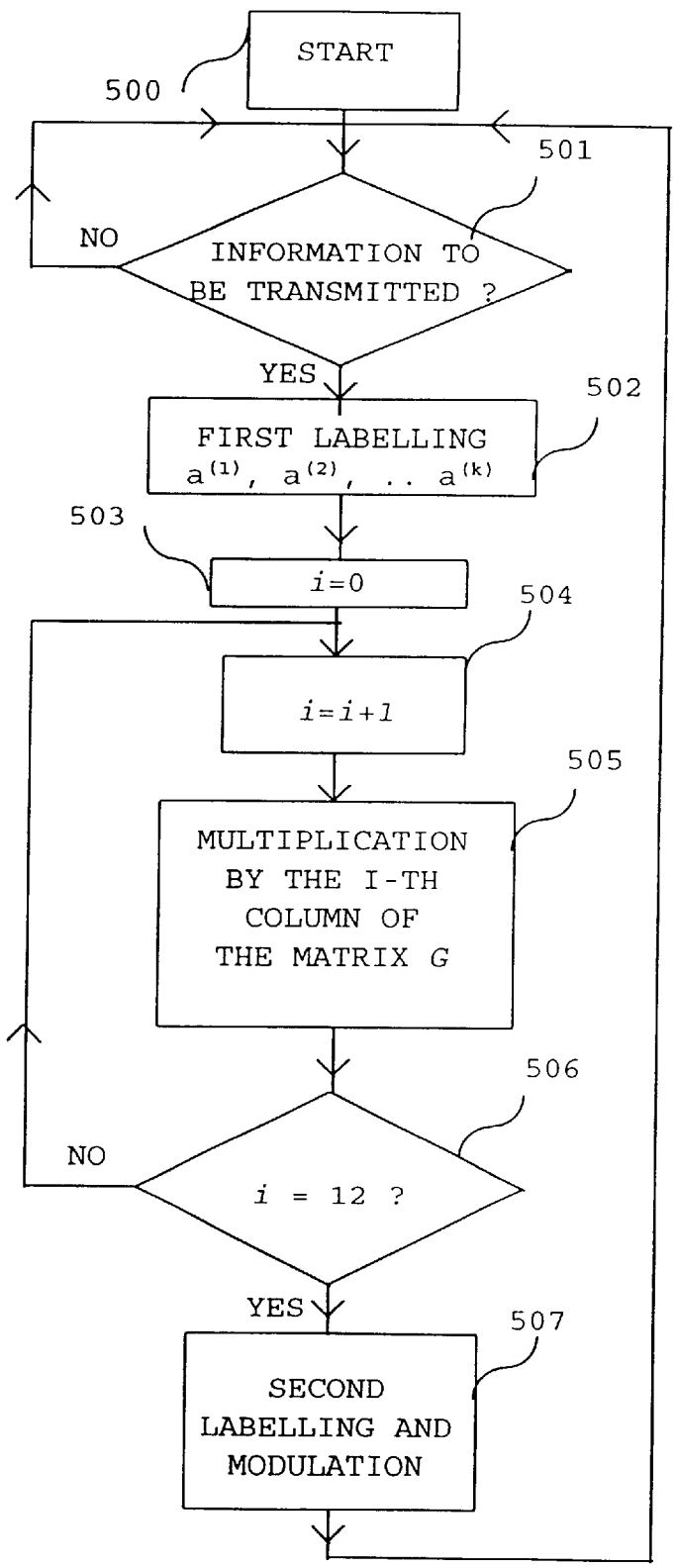
Figure 6:
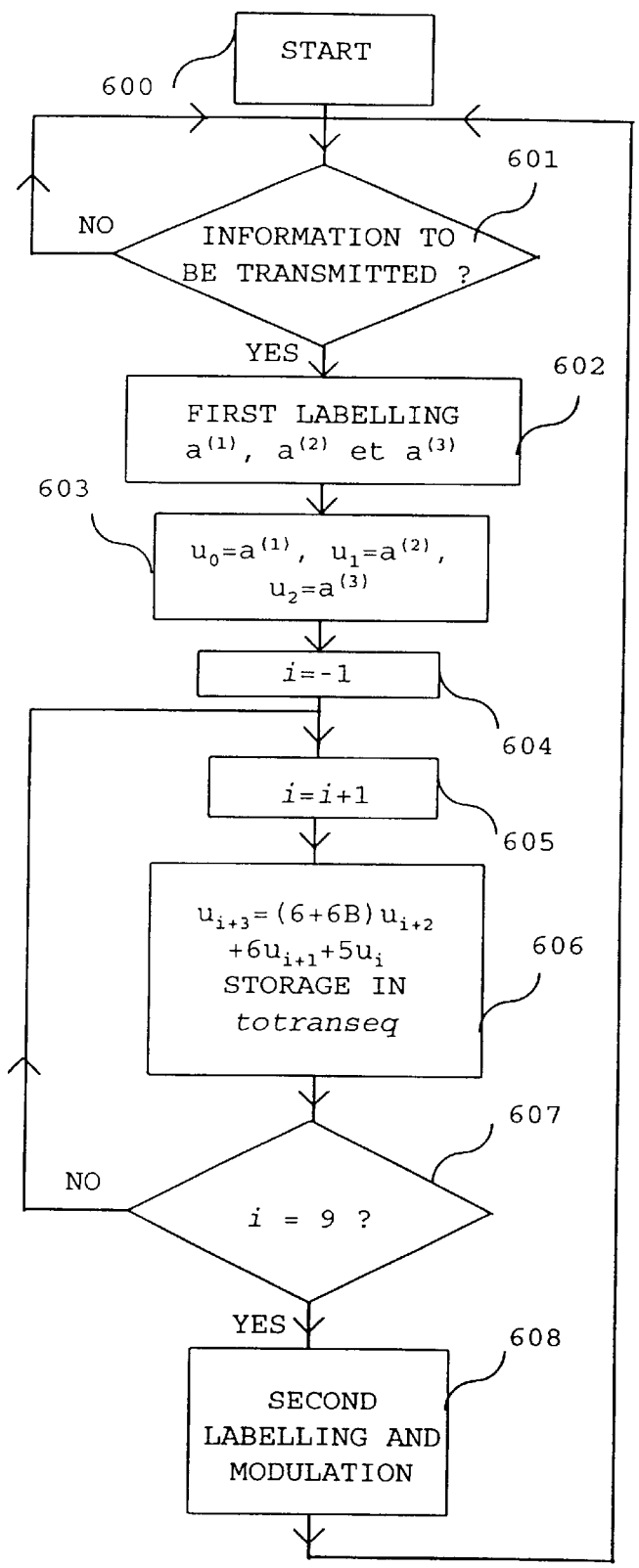
Figure 7:
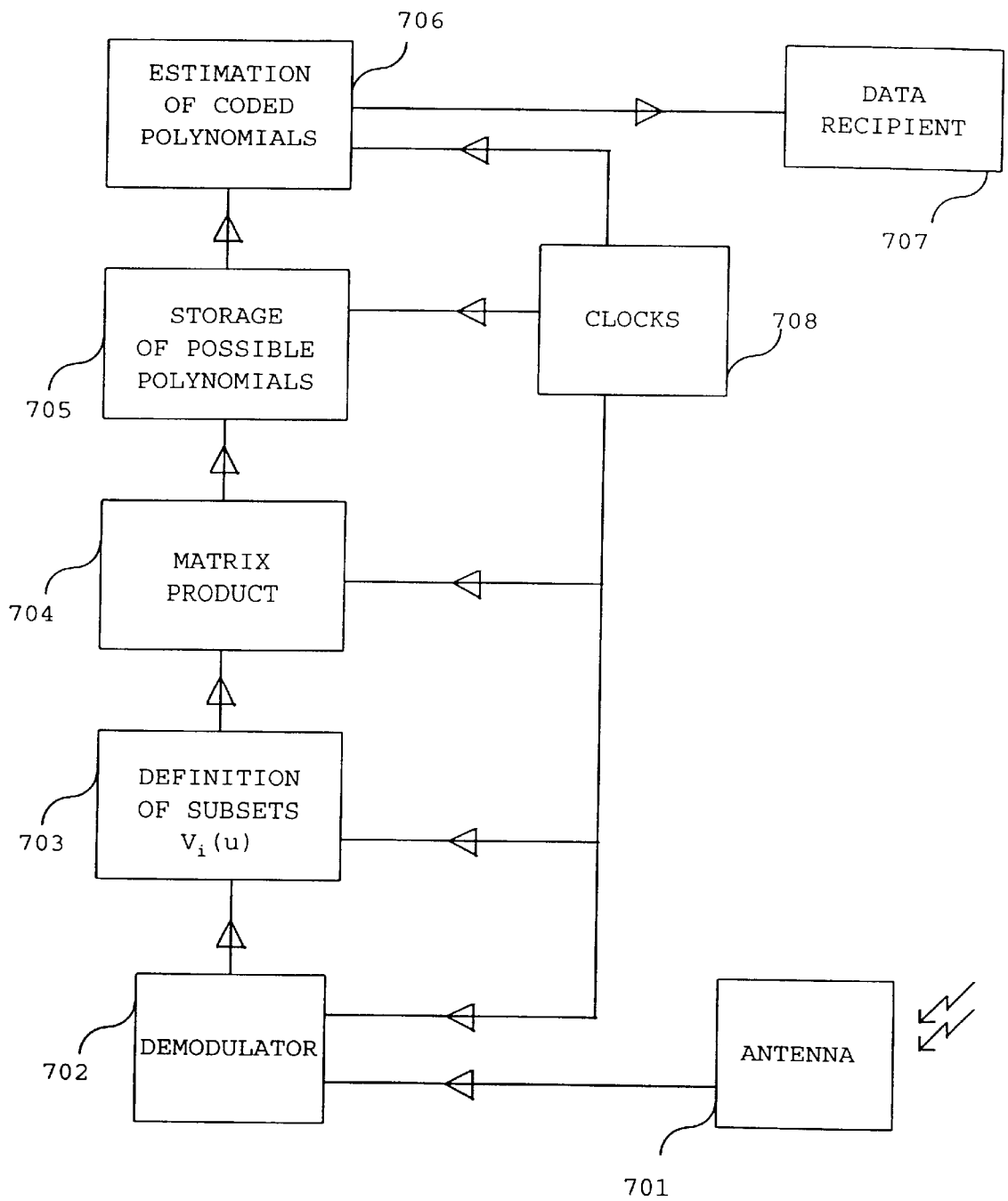
Figure 8:
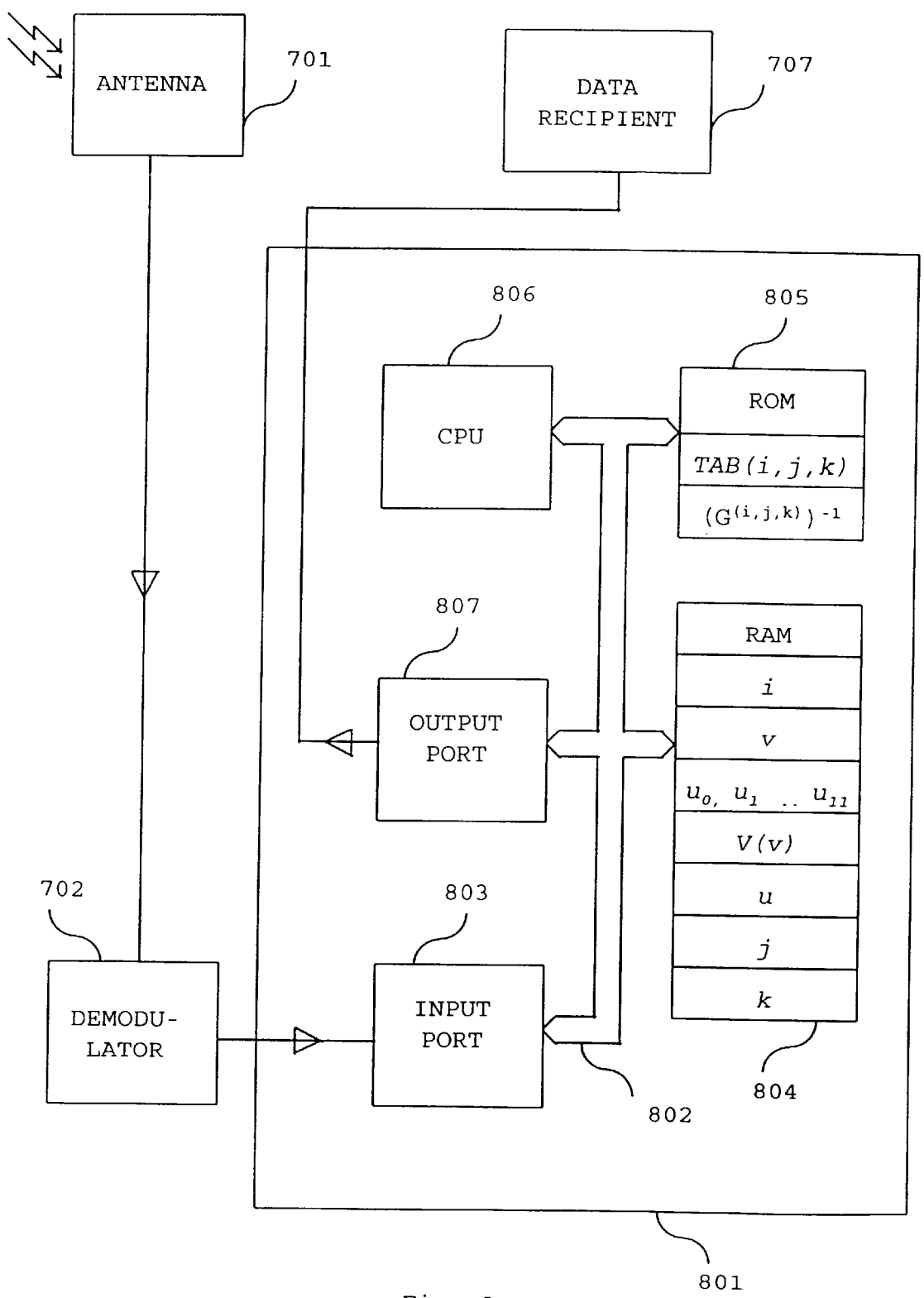
Figure 9:
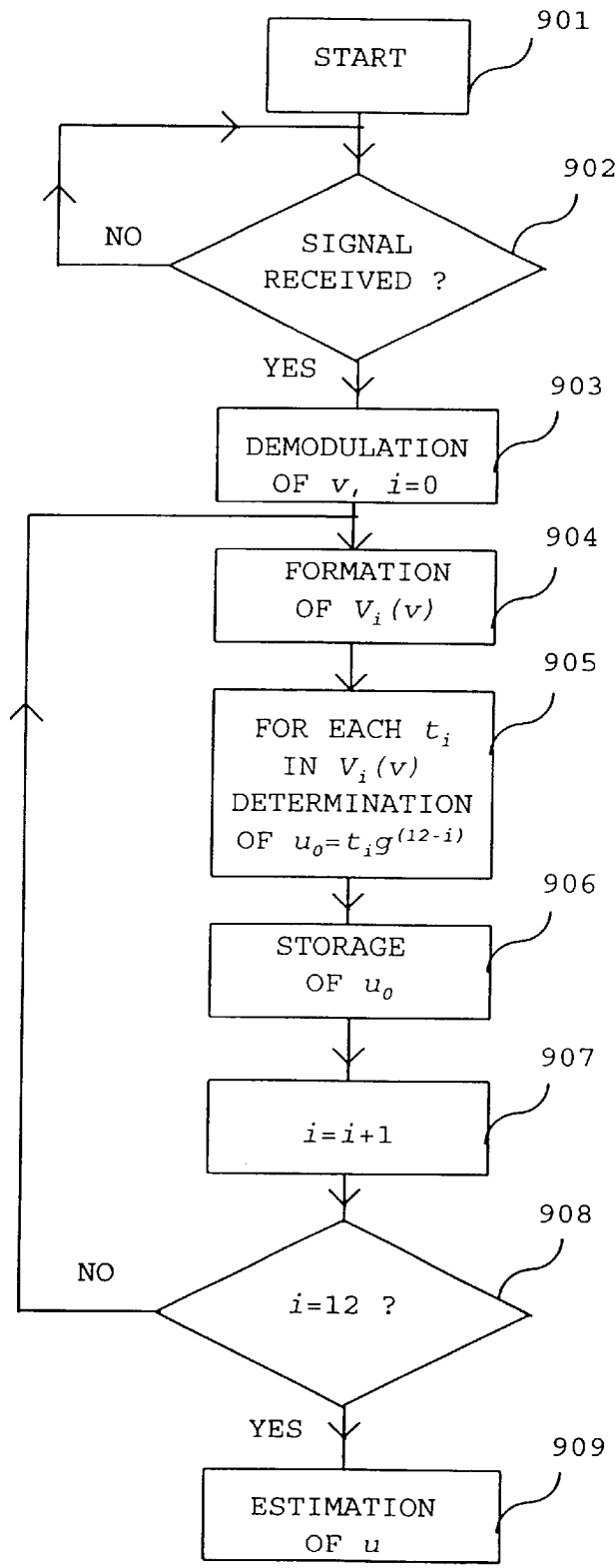
Figure 10:
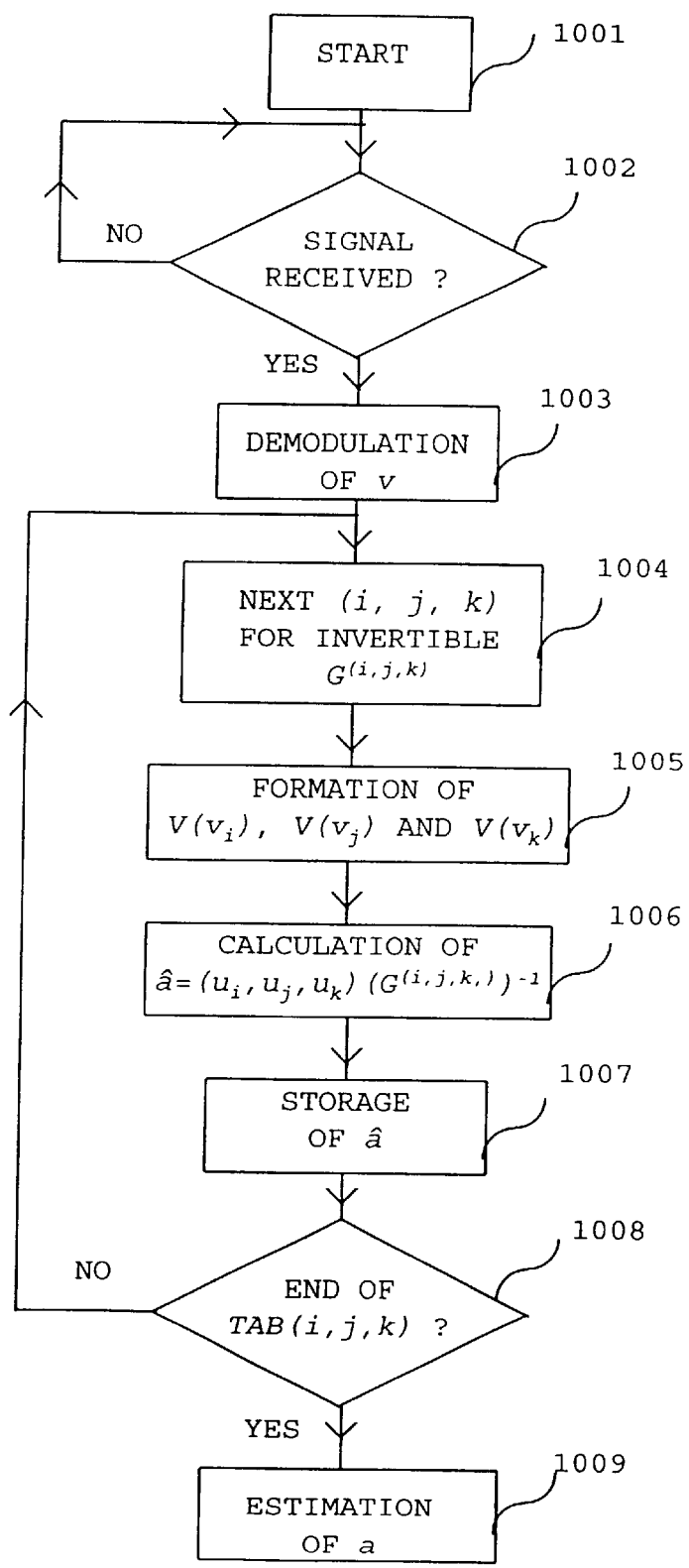
Figure 11:
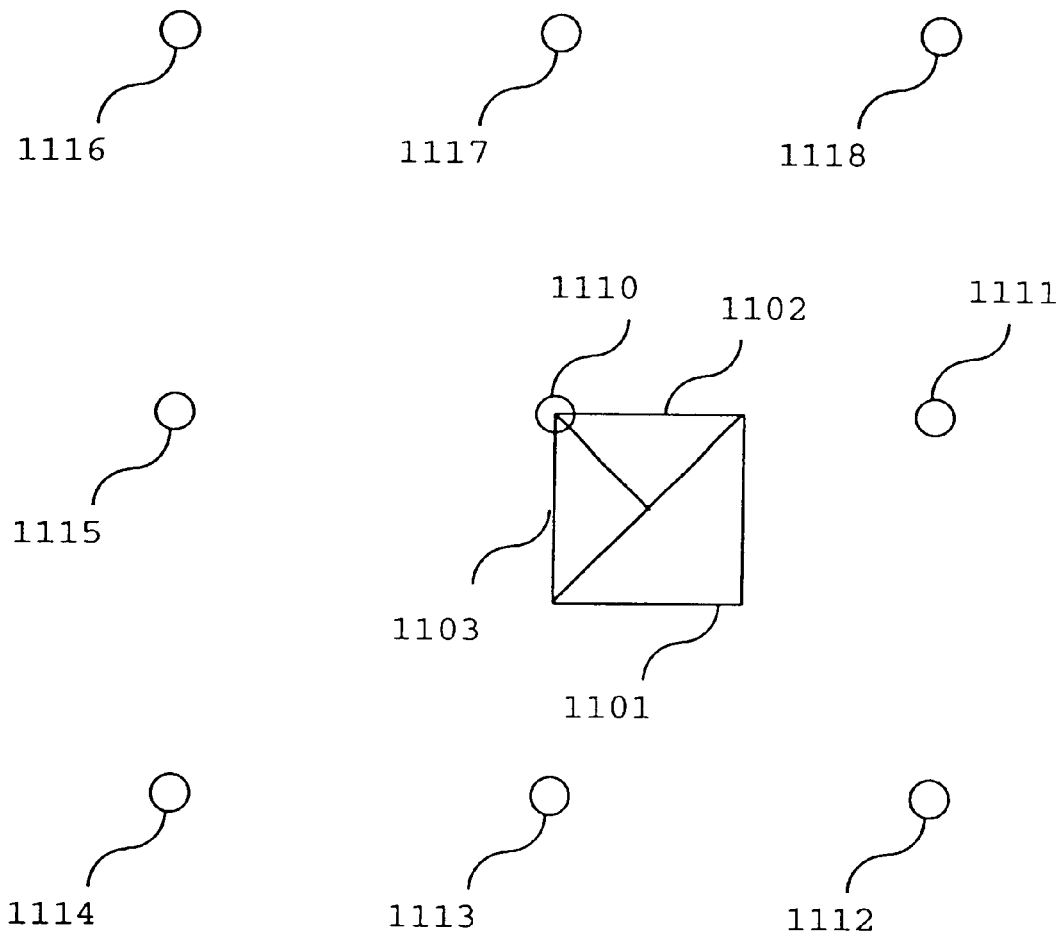
Figure 12:
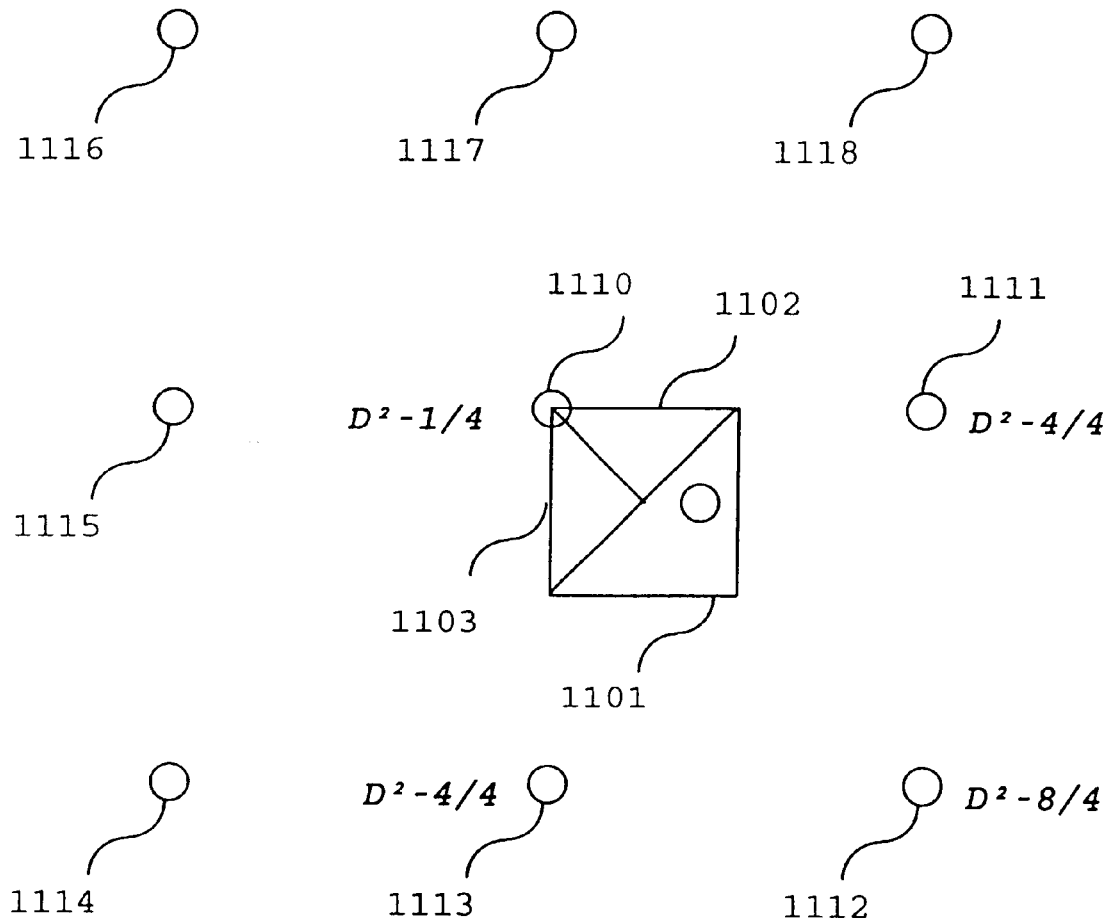
Figure 13:
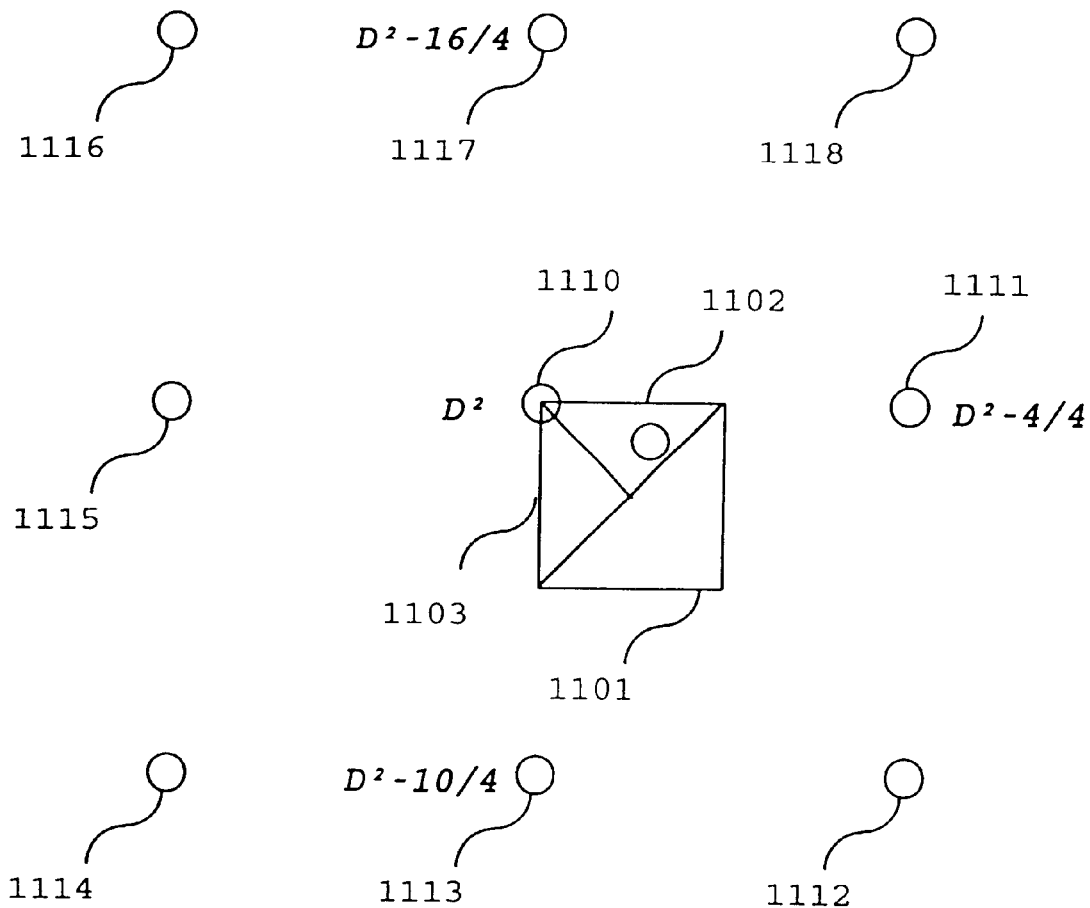

Other advantages, aims and characteristics will emerge from the following description, given with reference to the accompanying drawings in which:

FIG. 1 depicts, on a 64-QAM constellation, the start of a signal representing information of a 6-tuple, FIG. 2 depicts, on a 64-QAM constellation, the start of four sequences, the second symbol of which is among the four closest neighbors of a received signal, FIG. 3 depicts a simplified functional diagram of a device for coding in the form of signals representing 6-tuples of information, FIG. 4 depicts a simplified electronic diagram of a device for coding in the form of signals representing 6-tuples of information, FIG. 5 depicts a flow diagram for operation of the coding device illustrated in FIG. 4, by direct polynomial coding, FIG. 6 depicts a flow diagram for operation of the coding device illustrated in FIG. 4, by indirect polynomial coding, FIG. 7 depicts a simplified functional diagram of a device for decoding signals representing 6-tuples of information, FIG. 8 depicts a simplified electronic diagram of a device for decoding signals representing 6-tuples of information, FIG. 9 depicts a flow diagram for operation of the decoding device illustrated in FIG. 8, for the reception of information capable of being represented by a single 6-tuple, FIG. 10 depicts a flow diagram for operation of the decoding device illustrated in FIG. 8, for the reception of information capable of being represented by three 6-tuples, and FIGS. 11 to 13 illustrate a variant of the operational flow diagrams given with reference to FIGS. 9 and 10, according to which the neighboring polynomials and the affinities associated with initial polynomials which they represent are determined in a particularly simple manner.

In a 64-QAM constellation, that is to say one representing signals sent in quadrature amplitude modulation with Q=8 different values for the phase and phase quadrature signals, it may be useful, in order to code information, to provide this constellation with addition and/or multiplication operations, the results being calculated modulo Q=8.

Preferentially, Q is a power of a prime number, and, more preferentially, a power of 2, which makes it possible to use many well known mathematical tools.

Each 6-tuple is identified with a "initial" first degree polynomial in B, of the type $a=a_0+a_1 B$, where $a_0$ and $a_1$ are integers with values between 0 and Q−1=7, boundary values included, and where B is a symbol used in the calculations in accordance with the rule $1+B+B^2=0$. Each of the 64 polynomials is mapped with one of the 64-QAM signals by a labeling illustrated in FIGS. 1 and 2.

According to this labeling (subsequently called second labeling):

the factor of degree 0 in B is represented by the component in phase, in such a way that:
the factor 0 corresponds to the component −5
the factor 1 corresponds to the component −3
the factor 2 corresponds to the component −1
the factor 3 corresponds to the component +1
the factor 4 corresponds to the component +3
the factor 5 corresponds to the component +5
the factor 6 corresponds to the component +7
the factor 7 corresponds to the component −7
and the factor of degree 1 in B is represented by the component in phase quadrature, in such a way that:
the factor 0 corresponds to the component −5
the factor 1 corresponds to the component −3
the factor 2 corresponds to the component −1
the factor 3 corresponds to the component +1
the factor 4 corresponds to the component +3
the factor 5 corresponds to the component +5
the factor 6 corresponds to the component +7
the factor 7 corresponds to the component −7.

In the K=1 case, K being the number of 6-tuples of binary data which represent the information to be coded, this particular second labeling is one of those which make it possible to make the energies of the sequences of 12 signals, the composition of which is disclosed below, the least variable possible.

Performing the selection of the above second labeling from amongst the series of signals possible:

on the one hand, labeling of the $Q^2$ pairs of numbers representing the components of the $Q^2$ points of a $Q^2$-point quadrature amplitude modulation signal constellation, with $Q^2$ polynomials, is chosen in such a way that, if two points of the constellation have one identical co-ordinate and the other co-ordinate as close as possible, then the polynomials labeling them will have one identical coefficient and the other coefficient differing only by 1 modulo Q, and on the other hand, to represent the information to be transmitted, a set of series is chosen, a set of which the mean square deviation of the ratio of the energy over the mean energy of all series of the said set is smaller than it is on average for the other sets of series each containing the same number of series as the said set.

The set of elements a is a finite ring of polynomials, a ring which has 64 elements and which is referred to as $Z_8(B)$. It is provided with an addition operation and a multiplication operation, defined below, the integers being reduced modulo Q=8 and the polynomials in B being reduced modulo $B^2+B+1$.

By choosing one of the elements, g, of $Z_8(B)$ of which the first non-zero power which has the value 1 is the twelfth power (it is then said that the period of g is 12), for example g=1+7B, each item of information a of $Z_8(B)$ is then coded by the sequence (a, ag, ag$^2$, ..., ag$^{11}$), the multiplication used here being performed in $Z_8(B)$. Each element of this sequence is associated, by the second labeling, with an element of the 64-QAM constellation, as illustrated in FIG. 1. Transmission of the signal associated with the sequence (a, ag, ag$^2$, ..., ag$^{11}$) produces a method of encoding the 6-tuple considered.

Knowing any one of the elements of the sequence (u, ug, ug$^2$, ..., ug$^{11}$), also denoted ($u_0$, $u_1$, $u_2$, ..., $u_{11}$), the element u which is at its origin can be found.

However, on any channel, noise causes uncertainty on the actual value of u.

In this case, in order to estimate the value of u, it may be useful to observe a certain number N of closest neighbors of the approximate value $v_i$ of $u_i$. For example, for i=1 and N=4, FIG. 2 illustrates the "neighbors" $A_1$, $B_1$, $C_1$, and $D_1$ of $v_1=0.3+4.7$ B:

| | |
|---|---|
| $A_1$ is "labeled" | 0 + 5B |
| $B_1$ is "labeled" | 1 + 5B |
| $C_1$ is "labeled" | 0 + 4B |
| $D_1$ is "labeled" | 1 + 4B |

Multiplying these third labels by g$^{11}$, the points of the constellation which may correspond to the values $A_1$, $B_1$, $C_1$, and $D_1$: $A_0$, $B_0$, $C_0$ and $D_0$, are obtained, that is:

| | |
|---|---|
| $A_0$ labeled | $1 + 7B$ |
| $B_0$ labeled | $46 + 2B$ |
| $C_0$ labeled | $4 + 4B$ |
| $D_0$ labeled | $2 + 7B$. |

It can be seen in FIG. 2 that, although the points $A_1$, $B_1$, $C_1$ and $D_1$ are close in the 64-QAM constellation, the points $A_0$, $B_0$, $C_0$ and $D_0$ may not be.

The simplest version of the decoding method consists firstly of selecting a subset $V(v_i)$ of elements of the 64-QAM constellation which are close to $v_i$. Next, for each value of i (between 0 and 11), the label $t_i$, that is to say the first degree polynomial in B which is associated with each of the i elements of the subset $V(v_i)$, is multiplied by $g^{12-i}$, in order to obtain a label of an element of the 64-QAM constellation which is likely to be at the origin of the sequence ($u_0$, $u_1$, ..., $u_{11}$). The estimate of u will then be the element of $Z_8(B)$ whose label is most often considered as likely to be that of u, for all elements of the subsets $V(v_i)$, i going from 0 to 11.

It can be seen that a number of possibilities exist for specifying the subsets $V(v_i)$ of "neighboring" polynomials of a demodulated polynomial. The first consists of choosing the N elements of the constellation which are closest to $v_i$. A second possibility consists of defining $V(v_i)$ as the subset of elements of the constellation whose distance to $v_i$ is less than a predetermined distance. A third possibility consists of combining the first two possibilities: at most N elements of the 64-QAM constellation whose distance to $v_i$ is less than a predetermined value are selected.

According to a variant, the closeness information can be refined by defining an affinity which takes into account the actual distance of $v_i$ with each element of the subset $V(v_i)$. Thus, using the Euclidean distance d applied to the 64-QAM constellation, the affinity of $v_i$ with u, denoted aff($v_i$, u), will then be given by the maximum value of the two numbers $D^2-d^2(v_i,u)$ and 0, $D^2$ being a predetermined positive constant number. Before reception of the signals $v_i$, for each element u of the 64-QAM constellation, the function w(u) is initialized to 0. On reception of each $v_i$, each function w(u) is incremented by the value of the affinity of $v_i$ with u (an increment performed during the operation 906, FIG. 9). The decoding estimate (operation 909, FIG. 9) will then be the element u whose final function w(u) is highest, after reception of $v_{11}$.

Of course, the result is better as D increases since the maximum probability decoding method is then approached.

Encoding for a Number K of 6-tuples Equal to 2 or 3

It is to be considered that sets of 12, for K=2 (respectively 18, for K=3), binary data items are to be represented by sequences of length 12 of elements of $Z_8(B)$.

The K=3 case is to be considered first. The 18 binary data items are identified by a triplet $\underline{a}=(a^{(1)}, a^{(2)}, a^{(3)})$, of elements $a^{(i)}$ of $Z_8(B)$, referred to as "initial" polynomials. The "resultant" sequence of 12 "resultant" polynomials $\underline{v}=(v_0, v_1, \ldots v_{11})$ is then obtained by the matrix product $\underline{v}=\underline{a}G$, in which G is a 3×12 matrix of elements of $Z_8(B)$:

$$G = \begin{matrix} 1 & g & g^2 & g^3 & \cdots & g^{11} \\ 1 & g^2 & g^4 & g^6 & \cdots & g^{10} \\ 1 & g^3 & g^6 & g^9 & & g^9 \end{matrix} \qquad (1)$$

It can be seen that the matrix G is associated with its second column ($g$, $g^2$, $g^3$).

According to a variant, the triplet ($a^{(1)}$, $a^{(2)}$, $a^{(3)}$) is matched, not with the matrix product, but with the sequence $\underline{u}$ of $Z_8(B)$ determined by recurrence in the following manner:

$$u_0=a^{(1)}$$
$$u_1=a^{(2)}$$
$$u_2=a^{(3)}$$

$$u_{i+3}=(6+6B)u_{i+2}+6u_{i+1}+5u_i \qquad (2)$$

This resultant sequence corresponds to a matrix product of the triplet of initial polynomials ($a^{(1)}$, $a^{(2)}$, $a^{(3)}$) and an invertible matrix of dimensions 3×3, which is not explained here, in order to produce "previous" polynomials, then by a multiplication of the result of this matrix product, consisting of the previous polynomials, by the matrix G.

Thus the use of an invertible matrix of dimensions K×K, a matrix equal to the inverse of the matrix consisting of the first K columns of the matrix G, makes it possible to make the coding systematic, that is to say the first K resultant polynomials each represent one and only one initial polynomial.

FIG. 6 refers to this "indirect" coding, by comparison with the "direct" coding illustrated in FIG. 5.

The K=2 case is simpler. Twelve binary data items are to be coded here, associated with the sequence of initial polynomials $\underline{a}=(a^{(1)}, a^{(2)})$, in which $a^{(1)}$ and $a^{(2)}$ are elements of $Z_8(B)$. The encoding matrix G consists of the first two lines of the matrix given above at (1):

$$G = \begin{matrix} 1 & g & g^2 & g^3 & \cdots & g^{11} \\ 1 & g^2 & g^4 & g^6 & \cdots & g^{10} \end{matrix} \qquad (3)$$

and makes it possible to produce, by the same matrix product as disclosed above, the resultant polynomials.

As a variant, the method of encoding ($a^{(1)}$, $a^{(2)}$) is, by recurrence, defined by:

$$u_0=a^{(1)}$$
$$u_1=a^{(2)}$$

$$u_{i+2}=(1+4B)u_{i+1}+(3+6B)u_i \qquad (4)$$

The remarks made above concerning the first recurrence associated with K=3 being valid for this second recurrence, associated with K=2.

Decoding for K=3

$\underline{v}=(v_0, v_1, \ldots, v_{11})$ is the received and demodulated sequence originating from P modulated signals corresponding, by means of the second labeling, to the sequence of resultant polynomials, or transmitted code, $\underline{u}=(u_0, u_1, \ldots, u_{11})=\underline{a}G$, $\underline{v}$ being a "demodulated" sequence of P "demodulated" points or polynomials representing the K-tuple of "initial" information.

i, j and k are indices defined by $0 \leq i<j<k \leq 11$ and $G^{(i,j,k)}$ is the 3×3 matrix containing the columns of the matrix G with indices i, j and k:

$$G^{(i,j,k)} = \begin{matrix} g^i & g^j & g^k \\ g^{2i} & g^{2j} & g^{2k} \\ g^{3i} & g^{3j} & g^{3k} \end{matrix} \qquad (5)$$

It can be demonstrated that if the determinant of $G^{(i,j,k)}$ is an invertible element of $Z_8(B)$, then the inverse of $G^{(i,j,k)}$ exists and from $(u_i, u_j, u_k)=(a^{(1)}, a^{(2)}, a^{(3)}) G^{(i,j,k)}$, it is possible to find $\underline{a}=(a^{(1)}, a^{(2)}, a^{(3)})$ by use of $$\underline{a}=(u_i, u_j, u_k)(G^{(i,j,k)})^{-1} \qquad (6)$$

It is known that $G^{(i,j,k)}$ is invertible if and only if the modulo 3 remainders of i, j and k are all different. For example $G^{(2,6,10)}$ is invertible since the said modulo 3 remainders are 2, 0 and 1, whereas $G^{(4,5,7)}$ is not invertible since the said remainders are 1, 2 and 1.

In total there are 64 invertible $G^{(i,j,k)}$ matrices, associated with the triplets (i, j, k) with i in {0,3,6,9}, j in {1,4,7,10} and k in {2,5,8,11}.

By now defining three subsets of neighbors $V(v_i)$, $V(v_j)$ and $V(v_k)$ in $Z_8(B)$ respectively neighbors of the three signals $(v_i, v_j, v_k)$ relating to $a^{(1)}$, $a^{(2)}$ and $a^{(3)}$, for each possible $(u_i, u_j, u_k)$ with $G^{(i,j,k)}$ invertible, with $u_i$ in $V(v_i)$, $u_j$ in $V(v_j)$ and $u_k$ in $V(v_k)$, the estimate â of the information a is calculated, such that $$â=(u_i, u_j, u_k)(G^{(i,j,k)})^{-1} \quad (7)$$

and an affinity is assigned to it which depends upon the distance between the K-tuple of points represented by the K-tuple of neighboring polynomials $(u_i, u_j, u_k)$ and the K-tuple of component pairs represented by the chosen K-tuple of demodulated polynomials $(v_i, v_j, v_k)$ to which it is attached.

The decoded estimate is then the triplet a which has the sum of the affinities, when the equation (7) produces the said triplet, for all values i, j, k, $u_i$, $u_j$ and $u_k$.

The decoding method can be refined as explained above for the K=1 case. For example for K=3, at the start, the weighting w(a) is initialized to 0 for each a of $Z_8(B)$. The affinity of a with $(v_i, v_j, v_k)$ is defined as the maximum of 0 and $D^2-d^2(v_i,u_i)-d^2(v_j,u_j)-d^2(v_k,u_k)$, $D^2$ being a positive number.

For each value of (i,j,k) corresponding to an invertible matrix, the value of w(a) is incremented by the affinity for each a and the decoding estimate is the triplet a which has the highest value of w(a).

Decoding for K=2

For K=2, G is a 2×12 matrix containing 48 invertible sub-matrices G(ij) corresponding to all pairs (i,j) such that $g^j-g^j$ has an inverse through the multiplication operation, a condition equivalent to different modulo 3 remainders. The decoding method is then similar to that disclosed above for K=3.

Variants

According to a variant, each element $a^{(i)}$ of each triplet, out of the 64 possible elements, is calculated, and not each triplet $(a^{(1)}, a^{(2)}, a^{(3)})$, which reduces the memory to three (for K=3) times 64 elements, compared with the $64^3$= 262144 triplets.

According to another variant, the signal/noise ratio is estimated and the number of neighbors considered is reduced when the signal/noise ratio is high, in order to reduce the complexity or slowness of the method.

According to another variant, an affinity is taken equal to the distance for a given subset, then to the distance of the closest point outside the subset for all elements outside the subset.

Description of a Particular Embodiment

The particular embodiment described and depicted concerns the coding of binary information capable of being represented by a number K of 6-tuples, and the transmission of quadrature amplitude modulated signals, using 64 different amplitude couples.

FIG. 1 depicts, on a 64-QAM constellation, the start of a signal representing information items of a single 6-tuple (K=1).

It can be seen therein that, a 6-tuple having been associated with a "initial" polynomial a=2+7B, the first four "resultant" polynomials of the "resultant" sequence u which correspond to this initial polynomial are:

$u_0=2+7B$, $u_1=u_0(1+7B)=2+7B+14B+49B^2=2-49-49B+21B=-47-28B=1+4B$, $u_2=5+7B=u_1(1+7B)$, and $u_3=4+B=u_2(1+7B)$.

In the same way for 12>i>3, $u_i=u_{i-1}(1+7B)=u_{i-1}g$.

an equation in which g=1+7B is a particular polynomial whose period is 12, the factors of degree 0 and 1 in B being calculated modulo Q=8, and $B^2$ being replaced by −7−7B.

The transmitted signal which corresponds to the 6-tuple of binary information then consists of the succession of 12 signals whose phase and phase quadrature amplitudes correspond to the "resultant" polynomials $u_i$, with the matching, or second labeling, of the 64-QAM constellation with these polynomials which is illustrated in FIG. 1:

the factor of degree 0 in B is represented by the component in phase, in such a way that:
the factor 0 corresponds to the component −5
the factor 1 corresponds to the component −3
the factor 2 corresponds to the component −1
the factor 3 corresponds to the component +1
the factor 4 corresponds to the component +3
the factor 5 corresponds to the component +5
the factor 6 corresponds to the component +7
the factor 7 corresponds to the component −7 and the factor of degree 1 in B is represented by the component in phase quadrature, in such a way that:
the factor 0 corresponds to the component −5
the factor 1 corresponds to the component −3
the factor 2 corresponds to the component −1
the factor 3 corresponds to the component +1
the factor 4 corresponds to the component +3
the factor 5 corresponds to the component +5
the factor 6 corresponds to the component +7
the factor 7 corresponds to the component −7.

When K is greater than or equal to two, that is to say when a plurality of 6-tuples is to be represented by the sequence of twelve resultant polynomials, the i-th resultant polynomial of this sequence is the result of the sum of the matrix products of the first 6-tuple and $g^i$, of the second 6-tuple and $g^{2i}$, . . . , and of the j-th 6-tuple and $g^{ji}$. Each resultant polynomial of the resultant sequence thus formed is matched with an amplitude couple according to the second labeling disclosed above before producing a quadrature amplitude modulation signal.

FIG. 3 depicts, in the form of a simplified functional diagram, a device for coding information in the form of signals representing 6-tuples of information.

A data generator 301 produces sequences of a number K of 6-tuples of binary data, which may, for example, come from a storage means, from a transmission means or from a data processing means.

A first labeling means 302 associates, one-to-one, with each of the K 6-tuples produced by the data generator 301, a polynomial of degree 1 in B referred to as an initial polynomial. For example, for K=3, 18 binary data items represented by three 6-tuples are represented by three initial polynomials $a^{(1)}$, $a^{(2)}$, $a^{(3)}$ of elements of $Z_8(B)$.

A coding means 303 performs a mapping of the initial polynomial produced by the first labeling means 302 with a sequence of 12 resultant polynomials.

In the K=3 case, the three 6-tuples are identified by the triplet of initial polynomials $\underline{a}=(a^{(1)}, a^{(2)}, a^{(3)})$, and this triplet is coded into a resultant sequence of 12 resultant polynomials $v=(v_0, v_1, \ldots v_{11})$, obtained by performing the matrix product $\underline{v}=\underline{a}G$, in which G is the 3×12 matrix of elements of $Z_8(B)$ $$G = \begin{matrix} 1 & g & g^2 & g^3 & \cdots & g^{11} \\ 1 & g^2 & g^4 & g^6 & \cdots & g^{10} \\ 1 & g^3 & g^6 & g^9 & \cdots & g^9 \end{matrix} \quad (1)$$

A second labeling means 308 next performs a second labeling, that is to say a mapping of the sequence of resultant polynomials produced by the polynomial coding means 303, with the sequence of 12 signal modulation phase and phase quadrature amplitude couples, according to the mapping rule disclosed above with reference to FIG. 1.

The data generator produces 12×K 6-tuples less often than the coding means produces amplitude couples. Thus a clock 305, which controls operation of the coding means 303 and the second labeling means 308, is associated with a counter 304 which divides the number of pulses from the clock 305 by 12×K and which provides the signals for synchronization of the data generator 301 and the first labeling means 302.

A modulator 306 of known type performs the quadrature amplitude modulation corresponding to the amplitude value couples transmitted to it by the second labeling means 308. An antenna 307 broadcasts the signals coming from the modulator 306.

FIG. 4 depicts a simplified electronic diagram of a device for coding information in the form of signals representing 6-tuples of information. This coding device is illustrated in block diagram form and depicted under general reference 401. It has, interconnected by an address and data bus 402:

a central processing unit 406;

a random access memory 404;

a read-only memory 405;

an input port 403 used to receive the information which the coding device is to transmit;

an output port 408 allowing the device to transmit the sequence of amplitude couples mapped with the sequence of resultant polynomials; and, independently of the bus 402:

the modulator 306 modulating an electrical signal by quadrature amplitude modulation by assigning to two signals in phase quadrature the amplitude couples coming to it from the output port 408;

the transmitting antenna 307 which transmits radio waves.

The random access memory 404 notably has registers in which are stored variables and intermediate data necessary for the operation of the coding device:

i which represents the index of a column of the Van Der Monde matrix;

j which represents the index of a line of the Van Der Monde matrix;

totranseq which contains the sequence of resultant polynomials and amplitude couples representing them according to the mapping rule explained in FIG. 1; and $a^{(1)}, a^{(2)}, \ldots, a^{(K)}$ which represent the initial polynomials which correspond to the 6-tuples of information to be coded by means of the first labeling.

The read-only memory 405 is adapted to store the operating program of the central processing unit 406 and the polynomial g which defines the Van Der Monde matrix used and the look-up table TABCOR matching the resultant polynomials and the amplitude couples of the 64-QAM constellation. The central processing unit 406 is adapted to implement the flow diagrams described in FIGS. 5 and 6.

FIG. 5 depicts a flow diagram for operation of the coding device illustrated in FIG. 4, for direct coding of the "initial" polynomials.

Following the start 500, a test 501 determines whether or not there is information to be transmitted. When the result of the test 501 is negative, the test 501 is reiterated.

When the result of the test 501 is positive, the operation 502 carries out a first labeling of each 6-tuple of information to be transmitted by associating this 6-tuple with an initial polynomial $a^{(i)}$ of $Z_8(B)$. The operation 503 next consists of initializing the value of the variable i to 0. The operation 504 then consists of incrementing the value of the variable i by 1.

The operation 505 next consists of multiplying the line matrix composed of the initial polynomials $a^{(1)}, a^{(2)}, \ldots a^{(K)}$ by the i-th column of the Van Der Monde matrix G described above;

the product of the polynomial $a^{(i)}$ and the polynomial $g^{(j)}$ being performed modulo Q=8 and modulo the second degree polynomial described above and producing a "coded" polynomial from a "coded" sequence of P=12 polynomials, the sum of the coded polynomials of rank i giving a "resultant" polynomial of rank i in a "resultant" sequence of polynomials, each coefficient being calculated modulo Q=8, and of storing the resultant polynomial in the register totranseq.

It can be seen that, in so doing, the coding means performs a polynomial calculation:

to form K "coded" sequences of a number P greater than or equal to K of "coded" polynomials, the first coded polynomial of each of these K sequences being equal to one of the K initial polynomials and each of the other coded polynomials of the said sequence being equal to the product of the polynomial preceding it in the sequence and a predetermined polynomial, the coefficients of the coded polynomials being calculated modulo Q and the coded polynomial being calculated modulo an irreducible second degree polynomial, and to form a "resultant" sequence of P "resultant" polynomials respectively equal to the modulo Q sums of the coded polynomials of same rank of the K coded sequences, The test 506 next determines whether or not the variable i has reached the value 12. When the result of the test 506 is negative, the operation 504 is reiterated. When the result of the test 506 is positive, the operation 507 consists of transmitting to the modulator the sequence of amplitude couples associated, according to the mapping rule explained with reference to FIG. 1 and referred to as second labeling, with the resultant polynomials, in order that the modulator performs the quadrature amplitude modulation of an electrical signal with the said amplitude couples.

FIG. 6 depicts a flow diagram for operation of the coding device illustrated in FIG. 4, by indirect polynomial coding, in the case where K=3.

The test 601 of the flow diagram of FIG. 6 corresponds to the test 501 of the flow diagram of FIG. 5. The operations 600, 602, 604, 605, and 608 of the flow diagram of FIG. 6 correspond respectively to the operations 500, 502, 503, 504 and 507 of the flow diagram of FIG. 5.

The operation 603 consists of determining the first three resultant polynomials $u_0$, $u_1$ and $u_2$, as being respectively equal to the polynomials $a^{(1)}$, $a^{(2)}$ and $a^{(3)}$.

The operation 606 consists of determining the following resultant polynomials according to the formula:

$$u_{i+3}=(6+6B)u_{i+2}+6u_{i+1}+5u_i \qquad (2)$$

It should be noted here that the coding means here performs the polynomial calculation by using a recurrence equivalent to:

during the operation 602, first labeling:
associating with the information to be coded K "previous" polynomials, and then
multiplying a matrix consisting of these K previous polynomials by an invertible matrix of dimensions K×K in order to produce the K initial polynomials, and during the operation 606, performing the matrix polynomial calculation disclosed with reference to the operation 505.

The test 607 determines whether or not the variable i has reached the value 9.

It can thus be seen that the coding may consist of any direct labeling (FIG. 5) or indirect labeling (FIG. 6) of the information to be transmitted.

The decoding devices and methods associated with the coding devices and methods disclosed with reference to FIGS. 1 and 3 to 6 will now be described.

FIG. 2 depicts the second value of a quadrature amplitude modulated signal received by a decoding device, in the case where K is equal to 1, that is to say when only one 6-tuple has been coded. This second signal value corresponds to the "demodulated" polynomial 0.4+4.6 B.

Four "neighboring" polynomials of the demodulated polynomial are defined, $A_1=0+5$ B, $B_1=1+5$ B, $C_1=0+4$B and $D_1=1+4$ B.

By multiplying these four polynomials by $g^{11}$, four values of initial polynomials are found which, in the present case, are the most likely to form an estimate of the value sought.

FIG. 7 depicts a simplified functional diagram of a device for decoding signals representing 6-tuples of information.

A receiving antenna 701 receives the radio signals and transmits them to a demodulator 702. The demodulator 702 produces "demodulated" polynomials representing amplitude couples of the radio signals received by the antenna 701. A subset definition means 703 associates with each demodulated polynomial a set $V_i(u)$ of neighboring polynomials.

A matrix product determination means 704 performs, for all square sub-matrices of the Van Der Monde matrix which are invertible, square sub-matrices composed of K columns referenced i, j, . . . , a matrix product of each line matrix composed of K neighboring polynomials of the demodulated polynomials respectively referenced i, j, . . . , and the inverse of the Van Der Monde sub-matrix considered.

A storage means 705 stores each of the K initial polynomials resulting from these matrix products, assigning to them an affinity which is a function of the distance between the component couples represented by the K-tuple of demodulated polynomials and by the K-tuple of neighboring polynomials which were used to determine the said initial polynomials.

An estimation means 706 estimates the polynomials representing the coded information as being equal to a matrix consisting of the K initial polynomials with the highest sum of affinities, once all the said invertible square sub-matrices have been used. The initial polynomials estimated by the estimation means 706 are transmitted to a data recipient, in order that these polynomials are processed, transmitted or stored, for example.

FIG. 8 depicts a simplified electronic diagram of a device for decoding signals representing 6-tuples of information.

This decoding device is illustrated in block diagram form and depicted under general reference 801. It has, interconnected by an address and data bus 802:

a central processing unit 806
a random access memory 804;
a read-only memory 805;
an input port 803 used to receive the information which the decoding device is to process;
an output port 807 allowing the device to transmit the sequence of estimated polynomials to the data recipient 707, and, independently of the bus 802:
the demodulator 702 receiving the signals coming to it from the receiving antenna 701 and transmitting amplitude couples to the input port 803.

The random access memory 804 notably has registers in which are stored variables and intermediate data necessary for the operation of the coding device:

i, j and k which represent the indices of the columns of the Van Der Monde matrix;

v which represents the estimated polynomials;

$u_0, u_1, \ldots u_{11}$, which contain the demodulated polynomials resulting from demodulation of the sequence of resultant polynomials; and V(v) which defines neighboring polynomials for each of the demodulated polynomials.

The read-only memory 805 is adapted to store the program allowing operation of the central unit 806, the inverses of the invertible sub-matrices which consist of K=3 columns of the Van Der Monde matrix, and the table TAB(i,j,k) of the triplets (i,j,k) of the set $\{0,3,6,9\} \times \{1,4,7,10\} \times \{2,5,8,11\}$.

FIG. 9 depicts a flow diagram for operation of the decoding device illustrated in FIG. 8, for the reception of information capable of being represented by a single 6-tuple and therefore also a single initial polynomial.

After the start 901, during which the sums of the affinities associated with each polynomial are reset to 0, the test 902 determines whether a quadrature amplitude modulated signal has been received. When the result of the test 902 is negative, the test 902 is reiterated.

When the result of the test 902 is positive, the operation 903 consists of demodulating the received signal into a "demodulated" sequence v of 12 "demodulated" polynomials associated with 12 successive amplitude couples presented by the said signal, according to the mapping rule explained with reference to FIG. 1.

The operation 904 consists of defining neighboring polynomials of each demodulated polynomial, for example by considering as neighboring polynomials only the four closest polynomials in the 64-QAM constellation. The operation 904 also consists of associating an affinity with each of the neighbors as a decreasing function of the distance between the demodulated polynomial and the said neighbor. It should be noted that the polynomials which are not considered to be neighbors thus have a zero affinity.

The operation 905 consists, for each neighboring polynomial $t_i$ of the i-th demodulated polynomial, of determining a polynomial $u_0 = t_i g^{(12-i)}$.

The operation 906 consists of storing the polynomial $u_0$, allocating to it an increment of the value of the affinity of $t_i$ with $v_i$. The operation 907 consists of incrementing the value of i by 1. The test 908 determines whether or not the variable i has reached the value 12.

When the result of the test 908 is negative, the operation 904 is reiterated. When the result of the test 908 is positive, the operation 909 performs the estimation of u, the polynomial representing the 6-tuple of information transmitted by the coding device, by taking the value of the polynomial $u_0$ which has the highest sum of affinities.

FIG. 10 depicts a flow diagram of operation of the decoding device illustrated in FIG. 8, for the reception of information capable of being represented by three 6-tuples.

The operations 1001, 1002 and 1003 correspond respectively to the operations 901, 902 and 903 of the flow diagram of FIG. 9.

The operation 1004 consists of taking, from the table TAB(i,j,k), the next triplet of values (i,j,k) which corresponds to column numbers of the Van Der Monde matrix G which form an invertible 3×3 sub-matrix.

The operation 1005 consists of forming triplets of neighboring polynomials of the triplet of demodulated polynomials ($u_i$, $u_j$, $u_k$) and of allocating, to each of these triplets of neighboring polynomials, an affinity which is a decreasing function of the sum of the squares of the Euclidean distances of each of the points represented by a neighboring polynomial (by the second labeling) with the component pair of the corresponding demodulated polynomial.

The operation 1006 consists of calculating a triplet of polynomials $\hat{a}=(u_i,u_j,u_k)(G^{(i,j,k)})^{-1}$
where
($u_i,u_j,u_k$) is the line matrix composed of the three polynomials $u_i$, $u_j$ and $u_k$;
and $(G^{(i,j,k)})^{-1}$ is the inverse matrix of the matrix composed of the columns numbered i, j and k of the Van Der Monde matrix (1).

The operation 1007 consists of storing the triplet a of initial polynomials, assigning to it the affinity defined during the operation 1005.

The test 1008 determines whether all the triplets in the table TAB(i,j,k) have been used. When the result of the test 1008 is negative, the operation 1004 is reiterated. When the result of the test 1008 is positive, the operation 1009 consists of estimating the triplet of initial polynomials representing the three 6-tuples of data transmitted by the coding device as being the triplet with the highest sum of affinities.

According to a variant, the K-tuples of neighboring polynomials of a K-tuple of demodulated polynomials are determined as being the $N^K$ K-tuples of polynomials of which the polynomial of each rank in the said K-tuple represents one of the N points of the constellation closest to the component pair represented by the demodulated polynomial of same rank in the K-tuple of demodulated polynomials.

In particular, FIGS. 11 to 13 illustrate a variant of the operational flow diagrams given with reference to FIGS. 9 and 10, according to which the neighboring polynomials and the affinities associated with initial polynomials which they represent are determined in a particularly simple manner.

According to this variant, conversion tables stored in read-only memory are used to allocate, to each component pair represented by a demodulated polynomial, a list of neighbors and, to each neighboring polynomial thus determined, an affinity with the said demodulated polynomial, an affinity decreasing with the distance between the component pairs represented by the demodulated and neighboring polynomials.

This variant has the advantage of being implemented by very simple high-speed electronic circuits.

FIG. 11 depicts a division into three areas of a square design which, by axial symmetry whose axes are the sides of the said design, makes it possible to cover the whole of the 64-QAM constellation.

Here, N is equal to 4. For each demodulated polynomial, the 4 neighboring polynomials are determined to be the 4 polynomials of the constellation closest to the component pair represented by the demodulated polynomial, using a look-up table which maps:

the component pairs of the area 1101 with the four points of the constellation

| | |
|---|---|
| 1110 | assigned the affinity max $\{D^2 - 2/4, 0\}$ |
| 1111 | assigned the affinity max $\{D^2 - 4/4, 0\}$ |
| 1112 | assigned the affinity max $\{D^2 - 8/4, 0\}$, and |
| 1113 | assigned the affinity max $\{D^2 - 4/4, 0\}$ |

(FIG. 12)

the component pairs of the area 1102 with the four points of the constellation

| | |
|---|---|
| 1110 | assigned the affinity $D^2$ |
| 1111 | assigned the affinity max $\{D^2 - 4/4, 0\}$, |
| 1113 | assigned the affinity max $\{D^2 - 10/4, 0\}$, and |
| 1117 | assigned the affinity max $\{D^2 - 16/4, 0\}$ |

(FIG. 13)

the component pairs of the area 1103 with the four points of the constellation

| | |
|---|---|
| 1110 | assigned the affinity $D^2$ |
| 1111 | assigned the affinity max $\{D^2 - 10/4, 0\}$, |
| 1113 | assigned the affinity max $\{D^2 - 4/4, 0\}$, and |
| 1115 | assigned the affinity max $\{D^2 - 16/4, 0\}$. |

As stated above, D2 may be chosen arbitrarily.
According to variants:
the neighbors of a K-tuple of demodulated polynomials are determined as being those which represent a K-tuple of points of the constellation of which the distance to the K-tuple of component pairs represented by the said K-tuple of demodulated polynomials, in the constellation, is less than a threshold value,
the neighbors of a K-tuple of demodulated polynomials are determined as being those which represent a K-tuple of points of the constellation, each component of which is equal or immediately greater or less than the corresponding component of the K-tuple of component pairs represented by the K-tuple of demodulated polynomials,
the neighbors of a K-tuple of demodulated polynomials are determined as being a predetermined number N of K-tuples of polynomials which represent the N K-tuples of points of the constellation which are closest to the K-tuple of component pairs represented by the said K-tuple of demodulated polynomials, or
N being a predetermined number, the neighbors of a K-tuple of demodulated polynomials are determined as being the $N^K$ K-tuples of polynomials of which the polynomial of each rank in the said K-tuple represents one of the N points of the constellation which are closest to the component pair represented by the demodulated polynomial of same rank in the K-tuple of demodulated polynomials.

each K-tuple of initial polynomials is assigned the same affinity.

The scope of the invention is not limited to the embodiments described and depicted but on the contrary extends to the improvements and modifications within the capability of persons skilled in the art.

What is claimed is:

1. Device for coding information, characterized in that it has:
    a first labeling means (302, 404 to 406) adapted to associate with the information to be coded, K initial first degree polynomials, each of these two coefficients of the said initial polynomials being an integer number between 0 and Q−1 inclusive,
    a coding means (303, 404 to 406) which performs a polynomial calculation (502 to 506, 602 to 607):
        to form K coded sequences of a number P greater than or equal to K of coded polynomials, the first coded polynomial of each of these K sequences being equal to one of the K initial polynomials and each of the other coded polynomials of the said sequence being equal to the product of the polynomial preceding it in the sequence and a predetermined polynomial, the coefficients of the coded polynomials being calculated modulo Q and the coded polynomial being calculated modulo an irreducible second degree polynomial, and
        to form a resultant sequence of P resultant polynomials respectively equal to the modulo Q sums of the coded polynomials of same rank of the K coded sequences,
    a second one-to-one labeling means (308, 404 to 406) adapted to label the $Q^2$ pairs of numbers representing the co-ordinates of the $Q^2$ points of a $Q^2$-point quadrature amplitude modulation signal constellation, with the $Q^2$ resultant polynomials, in such a way that, if two points of the constellation have one identical co-ordinate and the other co-ordinate as close as possible, then the polynomials labeling them will have one identical coefficient and the other coefficient differing only by 1 modulo Q, and
    a modulator (306) adapted to convert each of the P resultant polynomials into a quadrature amplitude modulated signal, the amplitude pair of which is labeled by the said polynomial.

2. Device according to claim 1, characterized in that the number Q is a power of a prime number.

3. Device according to claim 1, characterized in that the coding means (303, 404 to 406) uses a matrix having:
    K rows of a number P greater than or equal to K, of elements representing polynomials in the finite ring of first degree polynomials with an integer coefficient taken modulo Q, and
    at least one sub-matrix of dimensions K×K adapted to be inverted.

4. Device according to claim 3, characterized in that the said matrix is a Van Der Monde matrix.

5. Device according to claim 1, characterized in that:
    Q is equal to eight,
    the modulation means (306) is adapted to use sixty-four pairs of amplitudes.

6. Device according to claim 1, characterized in that the predetermined polynomial used by the coding means (303, 404 to 406) has a period equal to twelve, each sequence of polynomials having a number P of polynomials which is equal to twelve.

7. Device according to claim 3, characterized in that the said matrix has K=2 rows, the information to be coded representing twelve independent binary values, the first labeling means (302, 404 to 406) associating, with these twelve binary values, two first degree polynomials in B, each coefficient of which takes an integer value between 0 and 7 inclusive.

8. Device according to claim 3, characterized in that the said matrix has K=3 rows, the information to be coded representing eighteen independent binary values, the first labeling means (302, 404 to 406) associating, with these eighteen binary values, three first degree polynomials in B, each coefficient of which takes an integer value between 0 and 7 inclusive.

9. Device according to claim 1, characterized in that the coding means (303, 404 to 406) performs the polynomial calculation (502 to 506, 602 to 607) by using a recursion (606).

10. Device according to claim 1, characterized in that the first labeling means (302) is adapted to associate, with the information to be coded, K previous polynomials and then to multiply a matrix formed by these K previous polynomials by an invertible matrix of dimensions K×K in order to produce the K initial polynomials.

11. Computer, characterized in that it has a device according to claim 1.

12. Facsimile machine, characterized in that it has a device according to claim 1.

13. Information capture system, characterized in that it has a device according to claim 1.

14. Information reproduction system, characterized in that it has a device according to claim 1.

15. Information processing system, characterized in that it has a device according to claim 1.

16. Method of coding information, characterized in that it includes:
    a first labeling operation (502, 602), during which K initial first degree polynomials are associated with the information to be coded, each of the two coefficients of the said initial polynomials being an integer number between 0 and Q−1, inclusive,
    a coding operation (503 to 506, 603 to 607) which performs a polynomial calculation:
        to form K coded sequences of a number P greater than or equal to K of coded polynomials, the first coded polynomial of each of these K sequences being equal to one of the K initial polynomials and each of the other coded polynomials of the said sequence being equal to the product of the polynomial preceding it in the sequence and a predetermined polynomial, the coefficients of the coded polynomials being calculated modulo Q and the coded polynomial being calculated modulo an irreducible second degree polynomial, and
        to form a resultant sequence of P resultant polynomials respectively equal to the modulo Q sums of the coded polynomials of same rank of the K coded sequences,
    a second operation of one-to-one labeling (507, 608) of $Q^2$ pairs of amplitudes by means of the $Q^2$ resulting polynomials able to be formed during the coding operation, any incrementation or decrementation of one of the components, by a predetermined value, when the other remains fixed, corresponding to the incrementation by 1, modulo Q, of only one of the coefficients of the resulting polynomial, the other coefficient remaining fixed, a modulation operation (507, 608), during which each of the P resulting polynomials is converted into a quadrature amplitude modulation signal where the pair of amplitudes is labeled by the said polynomial.

17. Coding method according to claim 16, characterized in that the number Q is a power of a prime number.

18. Information coding method according to claim 16, characterized in that, during the coding operation (503 to 506, 603 to 607), a matrix is used having:
   K rows of a number P, greater than or equal to K, of elements representing polynomials in the finite ring of first degree polynomials with an integer coefficient taken modulo Q, and
   at least one sub-matrix of dimensions K×K adapted to be inverted.

19. Coding method according to claim 18, characterized in that the said matrix is a Van Der Monde matrix.

20. Information coding method according to claim 16, characterized in that:
   Q is equal to eight,
   the modulation means is adapted to use sixty-four pairs of amplitudes.

21. Information coding method according to claim 16, characterized in that, during the coding operation (503 to 506, 603 to 607), a polynomial is used whose period is equal to twelve, each sequence of polynomials having a number P of polynomials equal to twelve.

22. Information coding method according to claim 18, characterized in that the said matrix has K=2 rows, the information to be coded representing twelve independent binary values, during the first labeling operation (502, 602), there are associated, with these twelve binary values, two first degree polynomials in B, each coefficient of which takes an integer value between 0 and 7 inclusive.

23. Information coding method according to claim 18, characterized in that the said matrix has K=3 rows, the information to be coded representing eighteen independent binary values, during the first labeling operation (502, 602), there are associated, with these eighteen binary values, three first degree polynomials in B, each coefficient of which takes an integer value between 0 and 7 inclusive.

24. Information coding method according to claim 16, characterized in that, during the coding operation (503 to 506, 603 to 607), the polynomial calculation is performed using a recursion.

25. Information coding method according to claim 16, characterized in that, during the first labeling operation (602), there are associated, with the information to be coded, K previous polynomials and then a matrix formed by these K previous polynomials is multiplied by an invertible matrix of dimensions K×K in order to produce the K initial polynomials.

26. System having a microprocessor, characterized in that the said microprocessor is adapted to implement the method according to claim 16.

27. Storage medium for storing thereon instructions which, when executed by a processor, cause the processor to implement the method according to claim 16.

28. Device for decoding coded initial information, characterized in that it has:
   a demodulator adapted to demodulate P signals modulated as the points of a quadrature amplitude modulation constellation, into a demodulated sequence of P demodulated points representing a K-tuple of initial information,
   a processing means adapted to:
      choose K-tuples of demodulated points likely to allow calculation of the K-tuple of initial information to which they correspond,
      determine, for each K-tuple of demodulated points chosen, K-tuples, referred to as "neighbors", of points in the said constellation which are close to the chosen K-tuple of demodulated points,
      calculate, for each K-tuple of neighboring points, the K-tuple of initial information to which it corresponds and assign to this K-tuple of initial information an affinity dependent upon the distance between the said K-tuple of neighboring points and the chosen K-tuple of demodulated points to which it is attached,
      add up,
         for each calculated K-tuple of initial information, or
         for each item of initial information of the calculated K-tuples of initial information,
      the affinities which are assigned to it, and
      estimate, respectively,
         the K-tuple of initial information actually coded, or
         each item of initial information of the K-tuple of initial information, actually coded as being the one which has the highest sum of affinities.

29. Device according to claim 28, characterized in that the distance between two K-tuples of component pairs of the constellation is a function of the sum of the K squares of Euclidean distances between the component pairs of same rank in the said K-tuples.

30. Device for decoding coded information, characterized in that it has:
   a demodulator adapted to demodulate P successive quadrature amplitude modulated signals, the two components of which represent the coefficients of K polynomials of the first degree referred to as "initial polynomials", into a demodulated sequence of P demodulated first degree polynomials, the coefficients of same degree of the said demodulated polynomials successively representing one of the components of the corresponding demodulated signal, and
   a processing means adapted to:
      choose K-tuples of demodulated polynomials likely to allow calculation of the K-tuple of initial polynomials to which they correspond,
      determine, for each K-tuple of demodulated polynomials chosen, K-tuples of neighboring polynomials representing K-tuples of points of the constellation close to the K-tuple of component pairs represented by the chosen K-tuple of demodulated polynomials,
      calculate, for each K-tuple of neighboring polynomials, the K-tuple of initial polynomials to which it corresponds and assign to this K-tuple of initial polynomials an affinity dependent upon the distance between the said K-tuple of points represented by the K-tuple of neighboring polynomials and the K-tuple of component pairs represented by the chosen K-tuple of demodulated polynomials to which it is attached,
      add up,
         for each calculated K-tuple of initial polynomials or
         for each initial polynomial of the calculated K-tuples of initial polynomials,
      the affinities which are assigned to it, and
      estimate, respectively,
         the K-tuple of initial polynomials actually coded or
         each initial polynomial of the K-tuple of initial polynomials, actually coded
      as being the one which has the highest sum of affinities.

31. Device according to claim 30, characterized in that, the two components representing the coefficients of a single polynomial of the first degree referred to as an "initial polynomial", K thus being equal to 1, the processing means is adapted to choose all the demodulated polynomials.

32. Device according to claim 30, characterized in that the neighbors of a K-tuple of demodulated polynomials are determined as being those which represent a K-tuple of points of the constellation of which the distance to the K-tuple of component pairs represented by the said K-tuple of demodulated polynomials, in the constellation, is less than a threshold value.

33. Device according to claim 30, characterized in that the neighbors of a K-tuple of demodulated polynomials are determined as being those which represent a K-tuple of points of the constellation, each component of which is equal or immediately greater or less than the corresponding component of the K-tuple of component pairs represented by the K-tuple of demodulated polynomials.

34. Device according to claim 30, characterized in that the neighbors of a K-tuple of demodulated polynomials are determined as being a predetermined number N of K-tuples of polynomials which represent the N K-tuples of points of the constellation which are closest to the K-tuple of component pairs represented by the said K-tuple of demodulated polynomials.

35. Device according to claim 30, characterized in that, N being a predetermined number, the neighbors of a K-tuple of demodulated polynomials are determined as being the $N^K$ K-tuples of polynomials of which the polynomial of each rank in the said K-tuple represents one of the N points of the constellation which are closest to the component pair represented by the demodulated polynomial of same rank in the K-tuple of demodulated polynomials.

36. Device according to claim 30, characterized in that it uses a matrix G of dimensions K×P.

37. Device according to claim 36, characterized in that the said matrix is a Van Der Monde matrix of type $$G = \begin{matrix} 1 & g & g^2 & g^3 & \cdots & g^{P-1} \\ 1 & g^2 & g^4 & g^6 & \cdots & g^{P-2} \\ \cdots & & & & \cdots & \cdots \\ 1 & g^k & g^{2k} & g^{3k} & \cdots & g^{P-k} \end{matrix}$$

g being a first degree polynomial whose period is equal to P.

38. Device according to claim 37, characterized in that, the two components of the P signals representing the coefficients of two polynomials of the first degree referred to as "initial polynomials", K thus being equal to 2, and the number Q of different values of the components of the initial polynomials being a power of 2,
the processing means is adapted to:
choose, from the sequence of P initial polynomials, the pairs of rank i and j whose modulo 3 remainders are different.

39. Device according to claim 37, characterized in that, the two components of the P signals representing the coefficients of three first degree polynomials referred to as "initial polynomials", K thus being equal to 3, and the number Q of different values of the components of the initial polynomials being a power of 2,
the processing means is adapted to:
choose, from the sequence of P initial polynomials, the triplets of rank i, j, k whose i, j and k modulo 3 remainders are all different.

40. Device according to claim 30, characterized in that the processing means is adapted to assign the same affinity to each K-tuple of initial polynomials.

41. Device according to claim 30, characterized in that the processing means is adapted to assign to each K-tuple of initial polynomials an affinity decreasing as a function of the distance between the K-tuple of points represented by the K-tuple of neighboring polynomials and the K-tuple of component pairs represented by the chosen K-tuple of demodulated polynomials to which it is attached.

42. Device according to claim 30, characterized in that the processing means is adapted to:
add up, for each initial polynomial of the calculated K-tuples of initial polynomials, the affinities which are assigned to it, and
estimate each initial polynomial of the K-tuple of initial polynomials actually coded as being the one which has the highest sum of affinities.

43. Device according to claim 30, characterized in that the processing means is adapted to:
add up, for each calculated K-tuple of initial polynomials, the affinities which are assigned to it, and
estimate the K-tuple of initial polynomials actually coded as being the one which has the highest sum of affinities.

44. Method of decoding coded initial information, characterized in that it consists of:
a demodulation operation, during which P signals modulated as the points of a quadrature amplitude modulation constellation are demodulated into a demodulated sequence of P demodulated points representing a K-tuple of initial information,
a processing phase consisting of:
a selection operation, during which K-tuples of demodulated points likely to allow calculation of the K-tuple of initial information to which they correspond are chosen,
a determination operation during which, for each of the chosen K-tuples of demodulated points, K-tuples, referred to as "neighbors", of points in the said constellation which are close to the chosen K-tuple of demodulated points are determined,
a calculation operation during which, for each K-tuple of neighboring points, the K-tuple of initial information to which it corresponds is calculated and this K-tuple of initial information is assigned an affinity dependent upon the distance between the said K-tuple of neighboring points and the chosen K-tuple of demodulated points to which it is attached,
a summation operation during which,
for each calculated K-tuple of initial information, or
for each item of initial information of the calculated K-tuples of initial information,
the affinities which are assigned to it are summed, and
an estimation operation during which, respectively,
the K-tuple of initial information actually coded, or
each item of initial information of the K-tuple of initial information, actually coded
is estimated as being the one which has the highest sum of affinities.

45. Decoding method according to claim 44, characterized in that the distance between two K-tuples of component pairs of the constellation is a function of the sum of the K squares of Euclidean distances between the component pairs of same rank in the said K-tuples.

46. Decoding method according to claim 44, characterized in that, during the calculation operation, a matrix G of dimensions K×P is used.

47. Decoding method according to claim 46, characterized in that the said matrix is a Van Der Monde matrix of type $$G = \begin{matrix} 1 & g & g^2 & g^3 & \cdots & g^{P-1} \\ 1 & g^2 & g^4 & g^6 & \cdots & g^{P-2} \\ \cdots & & & & \cdots & \cdots \\ 1 & g^k & g^{2k} & g^{3k} & \cdots & g^{P-k} \end{matrix}$$

g being a first degree polynomial whose period is equal to P.

48. Decoding method according to claim 47, characterized in that, the two components of the P signals representing the coefficients of two polynomials of the first degree referred to as "initial polynomials", K thus being equal to 2, and the number Q of different values of the components of the initial polynomials being a power of 2, during the selection operation, from the sequence of P demodulated polynomials, the pairs of rank i and j whose modulo 3 remainders are different are chosen.

49. Decoding method according to claim 47, characterized in that, the two components of the P signals representing the coefficients of three polynomials of the first degree referred to as "initial polynomials", K thus being equal to 3, and the number Q of different values of the components of the initial polynomials being a power of 2, during the selection operation, from the sequence of P demodulated polynomials, the triplets of rank i, j, k whose i, j and k modulo 3 remainders are all different are chosen.

50. Method of decoding coded information, characterized in that it consists of:

a demodulation operation during which P successive quadrature amplitude modulated signals are demodulated, the two components of which represent the coefficients of K polynomials of the first degree referred to as "initial polynomials", into a demodulated sequence of P demodulated first degree polynomials, the coefficients of same degree of the said demodulated polynomials successively representing one of the components of the corresponding demodulated signal, and a processing phase consisting of:

a selection operation during which K-tuples of demodulated polynomials likely to allow calculation of the K-tuple of initial polynomials to which they correspond are chosen, a determination operation during which, for each of the chosen K-tuples of demodulated polynomials, K-tuples of neighboring polynomials are determined, representing K-tuples of points of the constellation close to the K-tuple of component pairs represented by the chosen K-tuple of demodulated polynomials, a calculation operation, during which, for each K-tuple of neighboring polynomials, the K-tuple of initial polynomials to which it corresponds is calculated and this K-tuple of initial polynomials is assigned an affinity dependent upon the distance between the K-tuple of points represented by the said K-tuple of neighboring polynomials and the K-tuple of component pairs represented by the chosen K-tuple of demodulated polynomials to which it is attached, a summation operation, during which, for each calculated K-tuple of initial polynomials or for each initial polynomial of the calculated K-tuples of initial polynomials, the affinities which are assigned to it are added up, and an estimation operation, during which, respectively, the K-tuple of initial polynomials actually coded or each initial polynomial of the K-tuple of initial polynomials actually coded is estimated as being the one which has the highest sum of affinities.

51. Decoding method according to claim 50, characterized in that, the two components representing the coefficients of a single polynomial of the first degree referred to as an "initial polynomial", K thus being equal to 1, during the selection operation, all the demodulated polynomials are chosen.

52. Decoding method according to claim 50, characterized in that, during the determination operation, the neighbors of a K-tuple of demodulated polynomials are determined as being those which represent a K-tuple of points of the constellation of which the distance to the K-tuple of component pairs represented by the said K-tuple of demodulated polynomials, in the constellation, is less than a threshold value.

53. Decoding method according to claim 50, characterized in that, during the determination operation, the neighbors of a K-tuple of demodulated polynomials are determined as being those which represent a K-tuple of points of the constellation, each component of which is equal or immediately greater or less than the corresponding component of the K-tuple of component pairs represented by the K-tuple of demodulated polynomials.

54. Decoding method according to claim 50, characterized in that, during the determination operation, the neighbors of a K-tuple of demodulated polynomials are determined as being a predetermined number N of K-tuples of polynomials which represent the N K-tuples of points of the constellation which are closest to the K-tuple of component pairs represented by the said K-tuple of demodulated polynomials.

55. Decoding method according to claim 50, characterized in that, during the determination operation, N being a predetermined number, the neighbors of a K-tuple of demodulated polynomials are determined as being the $N^K$ K-tuples of polynomials of which the polynomial of each rank in the said K-tuple represents one of the N points of the constellation which are closest to the component pair represented by the demodulated polynomial of same rank in the K-tuple of demodulated polynomials.

56. Decoding method according to claim 50, characterized in that, during the calculation operation, each K-tuple of initial polynomials is assigned the same affinity.

57. Decoding method according to claim 50, characterized in that, during the calculation operation, each K-tuple of initial polynomials is assigned an affinity decreasing as a function of the distance between the K-tuple of points represented by the K-tuple of neighboring polynomials and the K-tuple of component pairs represented by the chosen K-tuple of demodulated polynomials to which it is attached.

58. Decoding method according to claim 50, characterized in that:

during the summation operation, for each initial polynomial of the calculated K-tuples of initial polynomials, the affinities which are assigned to it are added up, and during the estimation operation, each initial polynomial of the K-tuple of initial polynomials actually coded is estimated as being the one which has the highest sum of affinities.

59. Decoding method according to claim 50, characterized in that:
during the summation operation, for each calculated K-tuple of initial polynomials, the affinities which are assigned to it are added up, and
during the estimation operation, the K-tuple of initial polynomials actually coded is estimated as being the one which has the highest sum of affinities.

* * * * *